United States Patent
Nishikawa et al.

(10) Patent No.: US 9,188,946 B2
(45) Date of Patent: Nov. 17, 2015

(54) IMAGE FORMING APPARATUS INCLUDING DRAWER WITH VARIABLE LENGTH CABLE HOLDER

(71) Applicants: Tetsuji Nishikawa, Tokyo (JP); Yusuke Funayama, Kanagawa (JP); Hidehiko Maeda, Tokyo (JP); Junichi Kawase, Kanagawa (JP); Hiroshi Ishii, Kanagawa (JP); Joh Ebara, Kanagawa (JP); Kohta Takenaka, Kanagawa (JP); Yoshihide Ohta, Kanagawa (JP); Kohta Hirakawa, Tokyo (JP); Toshihiro Shimada, Kanagawa (JP); Yusuke Masu, Kanagawa (JP); Makoto Suzuki, Kanagawa (JP)

(72) Inventors: Tetsuji Nishikawa, Tokyo (JP); Yusuke Funayama, Kanagawa (JP); Hidehiko Maeda, Tokyo (JP); Junichi Kawase, Kanagawa (JP); Hiroshi Ishii, Kanagawa (JP); Joh Ebara, Kanagawa (JP); Kohta Takenaka, Kanagawa (JP); Yoshihide Ohta, Kanagawa (JP); Kohta Hirakawa, Tokyo (JP); Toshihiro Shimada, Kanagawa (JP); Yusuke Masu, Kanagawa (JP); Makoto Suzuki, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 13/971,958

(22) Filed: Aug. 21, 2013

(65) Prior Publication Data

US 2014/0055016 A1 Feb. 27, 2014

(30) Foreign Application Priority Data

Aug. 22, 2012 (JP) ................................. 2012-183332
Feb. 19, 2013 (JP) ................................. 2013-029899
Apr. 5, 2013 (JP) ................................. 2013-079578

(51) Int. Cl.
*G03G 21/16* (2006.01)
*H05K 5/02* (2006.01)
(Continued)

(52) U.S. Cl.
CPC ............ *G03G 21/1652* (2013.01); *B65H 1/266* (2013.01); *G03G 15/5016* (2013.01); *G03G 15/55* (2013.01); *G03G 15/70* (2013.01);
(Continued)

(58) Field of Classification Search
CPC .............. H05K 5/0247; H05K 7/1491; G03G 21/1633; G03G 2221/1684; G03G 21/1652; G03G 21/16; G03G 21/1638; G03G 15/5016; G03G 15/70
USPC .......................... 312/223.6; 400/693; 399/124
See application file for complete search history.

(56) References Cited

U.S. PATENT DOCUMENTS

2004/0057223 A1 * 3/2004 Hall .............................. 361/826
2005/0047827 A1 3/2005 Komoda et al. ................ 399/124

(Continued)

FOREIGN PATENT DOCUMENTS

EP 329935 A2 * 8/1989 ............... G02B 6/44
JP 04295316 A * 10/1992 ............... A47K 1/02

(Continued)

*Primary Examiner* — Daniel J Colilla
(74) *Attorney, Agent, or Firm* — Harness, Dickey & Pierce, P.L.C.

(57) ABSTRACT

The image forming apparatus includes an image forming section; a conveyance path to convey a recording medium to the image forming section; a drawer unit including the conveyance path and configured to be pulled out relative to the apparatus; an electrical cable to electrically connect the drawer unit and an interior of the apparatus even when the drawer unit is pulled out from the apparatus; and a cable holder (a first regulating member) to ensure that that the cable is securely prevented from protruding from the drawer unit. According to the present invention, the electric cable is prevented from running off from the drawer unit due to the folding of the cable caused by the regulating member, so that the electric cable is prevented from getting hung up on the parts disposed in the body.

15 Claims, 19 Drawing Sheets

(51) Int. Cl.
  *G03G 15/00* (2006.01)
  *B65H 1/26* (2006.01)
  *H04N 1/00* (2006.01)

(52) U.S. Cl.
  CPC ............ *G03G21/16* (2013.01); *G03G 21/1633* (2013.01); *G03G 21/1638* (2013.01); *H04N 1/0083* (2013.01); *H04N 1/00543* (2013.01); *H04N 1/00588* (2013.01); *H05K 5/0247* (2013.01); *B65H 2402/32* (2013.01); *B65H 2405/32* (2013.01); *B65H 2801/06* (2013.01); *G03G 2215/00548* (2013.01); *G03G 2221/1675* (2013.01); *G03G 2221/1684* (2013.01); *H04N 2201/0091* (2013.01)

(56) References Cited

U.S. PATENT DOCUMENTS

| | | | | |
|---|---|---|---|---|
| 2006/0087207 A1* | 4/2006 | Oh et al. | ......................... | 312/402 |
| 2006/0087208 A1* | 4/2006 | Oh et al. | ......................... | 312/402 |
| 2009/0256303 A1* | 10/2009 | Adachi et al. | ................ | 271/9.01 |
| 2012/0141053 A1* | 6/2012 | Yu et al. | ......................... | 384/35 |
| 2013/0050963 A1* | 2/2013 | Zhou et al. | ..................... | 361/752 |

FOREIGN PATENT DOCUMENTS

| | | | | |
|---|---|---|---|---|
| JP | 8-006472 | | 1/1996 | |
| JP | 11-120427 | | 4/1999 | |
| JP | 11-143258 | | 5/1999 | |
| JP | 11-166357 | | 6/1999 | |
| JP | 2000-198574 | | 7/2000 | |
| JP | 2001-038982 | | 2/2001 | |
| JP | 2003079457 A | * | 3/2003 | ............ A47B 88/00 |
| JP | 2003219925 A | * | 8/2003 | ............ A47B 88/00 |
| JP | 2004-045551 | | 2/2004 | |
| JP | 2004-102165 | | 4/2004 | |
| JP | 2004-333731 | | 11/2004 | |
| JP | 2005-017330 | | 1/2005 | |
| JP | 2005-070638 | | 3/2005 | |
| JP | 2006223046 A | * | 8/2006 | ............ H02G 11/00 |
| JP | 2006-231656 | | 9/2006 | |
| JP | 2007-304507 | | 11/2007 | |
| JP | 2010-078628 | | 4/2010 | |
| JP | 2011-151536 | | 8/2011 | |

* cited by examiner

IMAGE FORMING APPARATUS INCLUDING DRAWER WITH VARIABLE LENGTH CABLE HOLDER

CROSS-REFERENCE TO RELATED APPLICATION

The present application claims priority pursuant to 35 U.S.C. §119 from Japanese patent application numbers 2012-183332, 2013-029899, and 2013-079578, filed on Aug. 22, 2012, Feb. 19, 2013, and Apr. 5, 2013, the entire disclosures of which are incorporated by reference herein.

BACKGROUND

1. Technical Field

The present invention relates to an image forming apparatus such as a facsimile machine, a printer, or a copier.

2. Related Art

An image forming apparatus is known in which a jam sensor to detect an abnormal conveyance such as a paper jam is disposed in a sheet conveyance path, through which a recording medium such as a sheet passes. If abnormal conveyance is detected by the jam sensor, printing operation and conveyance of the sheet is suspended and the abnormal conveyance is reported to a control panel disposed on the apparatus. After the abnormal conveyance has been detected and the operation of the apparatus is stopped, the user pulls out a drawer unit composing the sheet conveyance path from the apparatus, so that the recording medium can be removed.

JP-2004-333731-A discloses an image forming apparatus including a drawer unit connected with an electric cable to the apparatus, in which electrical connection of the drawer unit is maintained even when the drawer unit is pulled out from the apparatus. With such a structure, even when the drawer unit is drawn from the apparatus, the apparatus is able to locate a position at which the jam occurs or the status of the removal of the jammed sheet and report to the user, prompting the user to fix the jam.

JP-2004-333731-A also discloses that, when the drawer unit is attached to the apparatus, the cable is gradually loosened and part of the cable sticks out from the drawer unit. As a result, the projecting part of the cable may get hung up on another part inside the apparatus. If the drawer unit is installed again with the cable caught on a part in the apparatus, the cable and/or the part may be damaged.

Accordingly, considering the above problem, the present invention provides an optimal image forming apparatus capable of both maintaining electrical connection of the drawer unit to the main body of the apparatus even after the drawer unit has been pulled out from the image forming section and of preventing the electrical communication cable connecting the apparatus with the drawer unit from the parts disposed in the apparatus.

SUMMARY

The present invention provides an optimal image forming apparatus comprising: an image forming section; a conveyance path to convey a recording medium to the image forming section; a drawer unit including the conveyance path and configured to be pulled out relative to the apparatus; an electrical cable to electrically connect the drawer unit and an interior of the apparatus even when the drawer unit is pulled out from the apparatus; and a cable holder (a first regulating member) to ensure that that the cable is securely prevented from protruding from the drawer unit. According to the present invention, the electric cable is prevented from running off from the drawer unit due to the folding of the cable caused by the regulating member, so that the electric cable is prevented from getting hung up on the parts disposed in the body. With this configuration, any damage to the electric cable and parts of the apparatus can be prevented.

These and other objects, features, and advantages of the present invention will become apparent upon consideration of the following description of the preferred embodiments of the present invention when taken in conjunction with the accompanying drawings.

DETAILED DESCRIPTION

First, referring to FIG. 1, an image forming apparatus 1 according to an embodiment of the present invention will be described. The image forming apparatus 1 according to the present embodiment is a tandem-type color copier.

Figure 1:
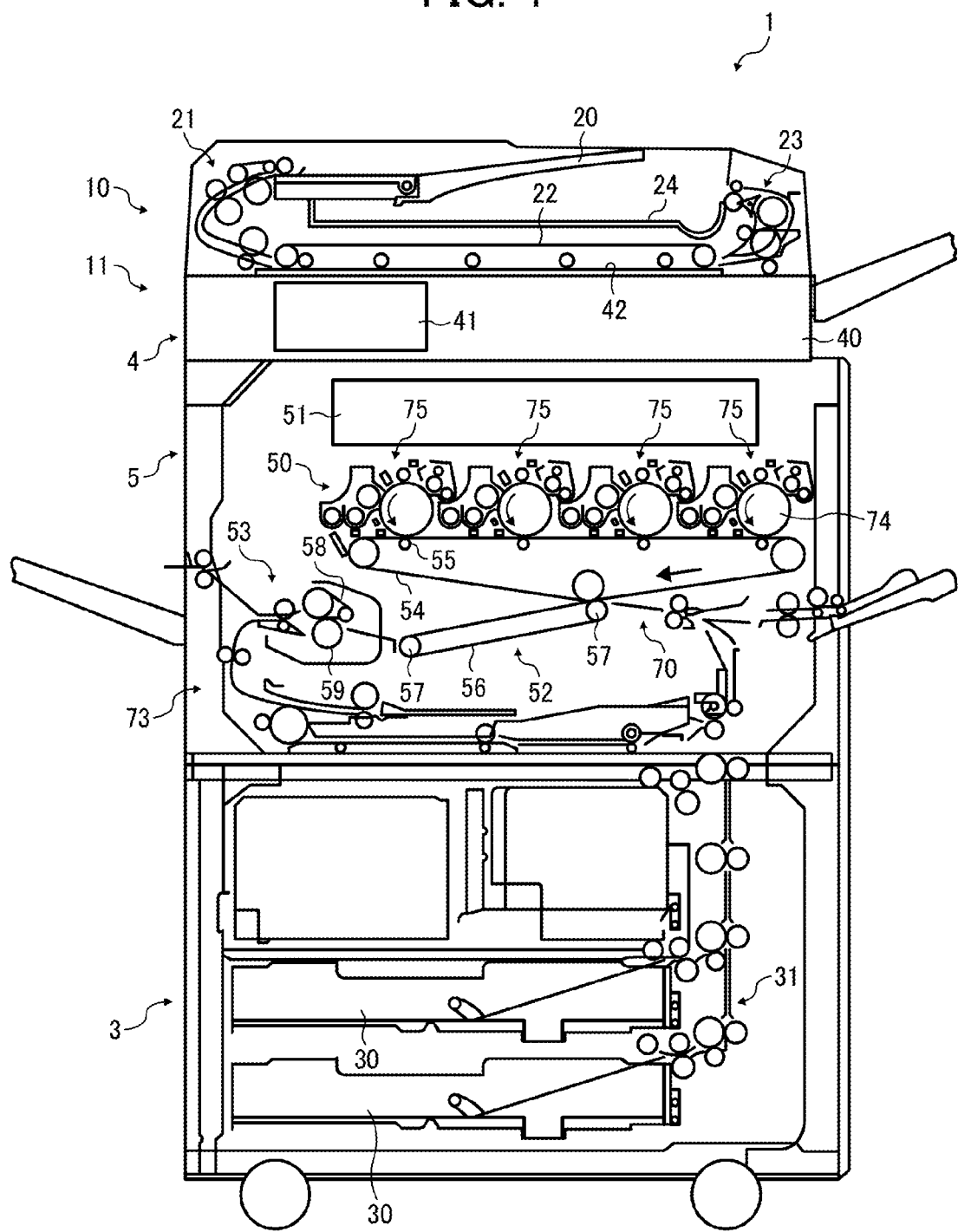
FIG. 1 is a schematic view of an image forming apparatus according to an embodiment of the present invention.

As illustrated in FIG. 1, the image forming apparatus 1 includes an automatic feeder (hereinafter, to be referred to as an ADF) 10 and a body 11. The body 11 includes a sheet feeding section 3, an image reading section 4, and an image forming section 5.

The ADF 10 includes a sheet tray 20, a sheet feed roller 21, a sheet conveyance belt 22, a sheet discharge roller 23, and a sheet discharge tray 24. The ADF 10 is openably closable and disposed on the image reading section 4, to which is connected by a hinge or the like (not shown).

When originals to be copied are placed on the sheet tray 20 as a sheet stack, the sheet feed roller 21 separates each sheet one by one from the sheet stack and conveys it toward the image reading section 4. The sheet conveyance belt 22 conveys the sheet separated by the sheet feed roller 21 to the image reading section 4. The sheet discharge roller 23 discharges the sheet discharged from the image reading section 4 via the sheet conveyance belt 22 to the sheet discharge tray 24 disposed below the sheet tray 20.

The image reading section 4 includes a housing 40, an optical scanning unit 41, a contact glass 42, and a driving means (not shown).

The optical scanning unit 41 disposed inside the housing 40 includes a light-emitting diode (LED) unit. The optical scanning unit 41 allows the LED unit to emit light in a main scanning direction and the driving means to scan in a sub-scanning direction over all irradiated areas. As a result, the optical scanning unit 41 reads a two-dimensional color image of the original.

The contact glass 42 disposed above the housing 40 of the image reading section 4 forms an upper part of the housing 40. The drive unit includes a wire (not shown) fixed on the optical scanning unit 41, a plurality of driven pulleys and a driving pulley bridged by this wire, and a motor to drive the driving pulley, with neither the driven pulleys nor the driving pulley shown.

The sheet feeding section 3 includes in this example two sheet trays 30 and a sheet feed device 31. The sheet tray 30 can contain different sizes of recording media or sheets. The sheet feed device 31 conveys the recording media contained in the sheet tray 30 to a main conveyance path 70 inside the image forming section 5.

The image forming section 5 includes an exposure unit 51, a tandem image forming apparatus 50, an intermediate transfer belt 54, an intermediate transfer roller 55, a secondary transfer device 52, a fuser unit 53 as a fixing device, the main conveyance path 70, and a reverse conveyance path 73 as a secondary conveyance path.

As illustrated in FIG. 1, the exposure unit 51 is disposed adjacent to the tandem image forming apparatus 50. The exposure unit 51 exposes each surface of a plurality of photoreceptor drums 74, one drum provided for each color.

The tandem image forming apparatus 50 includes four image forming units 75 corresponding to the colors yellow, cyan, magenta, and black, disposed along the rotation direction of the intermediate transfer belt 54. Each of the image forming units 75 includes, although a detailed drawing is omitted, around each photoreceptor drum 74, a charger, a developing device, a photoreceptor cleaning device, and a discharger. The parts or components disposed around the photoreceptor drum 74 are integrated to construct a process cartridge.

Based on the color-separated image information of an image read by the image reading section 4, the tandem image forming apparatus 50 forms a visible toner image on each of the photoreceptor drums 74 corresponding to each separated color. Each visible image formed on the photoreceptor drums 74 is transferred to the intermediate transfer belt 54 at positions between the photoreceptor drums 74 and the intermediate transfer rollers 55, respectively.

On the other hand, the secondary transfer device 52 is disposed at a position opposite the tandem image forming apparatus 50 with the intermediate transfer belt 54 in between. In the present example, the secondary transfer device 52 is formed such that a secondary transfer belt 56 being an endless belt is stretched around two support rollers 57. Then, by pressing the secondary transfer belt 56 against the intermediate transfer belt 54, the toner image formed on the intermediate transfer belt 54 is transferred to the recording medium conveyed from the sheet feeding section 3 via the main conveyance path 70. Alternatively, the secondary transfer device 52 may employ a structure formed of a secondary transfer roller instead of the secondary transfer belt 56.

The fuser unit 53 is disposed downstream of the secondary transfer device 52 in the conveyance direction of the recording medium. The fuser unit 53 is formed such that a pressure roller 59 is pressed against a fixing belt 58 (also an endless belt). The fuser unit 53 is configured such that the pressure roller 59 applies heat and pressure to the recording medium and the toner of the toner image transferred to the recording medium is fused and fixed onto the recording medium as a color image.

In addition, as shown in FIG. 1, the reverse conveyance path 73 is disposed below the secondary transfer device 52 and the fuser unit 53. The reverse conveyance path 73 causes the recording medium discharged from the fuser unit 53 to be reversed so that the image can be printed on both sides of the recording medium, and the recording medium now turned upside down is again supplied to the secondary transfer device 52 via the main conveyance path 70.

In addition, a plurality of sheet sensors are disposed along the conveyance path in the main conveyance path 70 as well as the reverse conveyance path 73. The number and the location of the sheet sensors are varied as needed. If each sheet sensor does not detect the passing of the recording medium within a predetermined time of period, it is determined that a sheet jam has occurred and an indication to that effect is displayed on a control panel, not shown, of the image forming apparatus 1.

Figure 2:
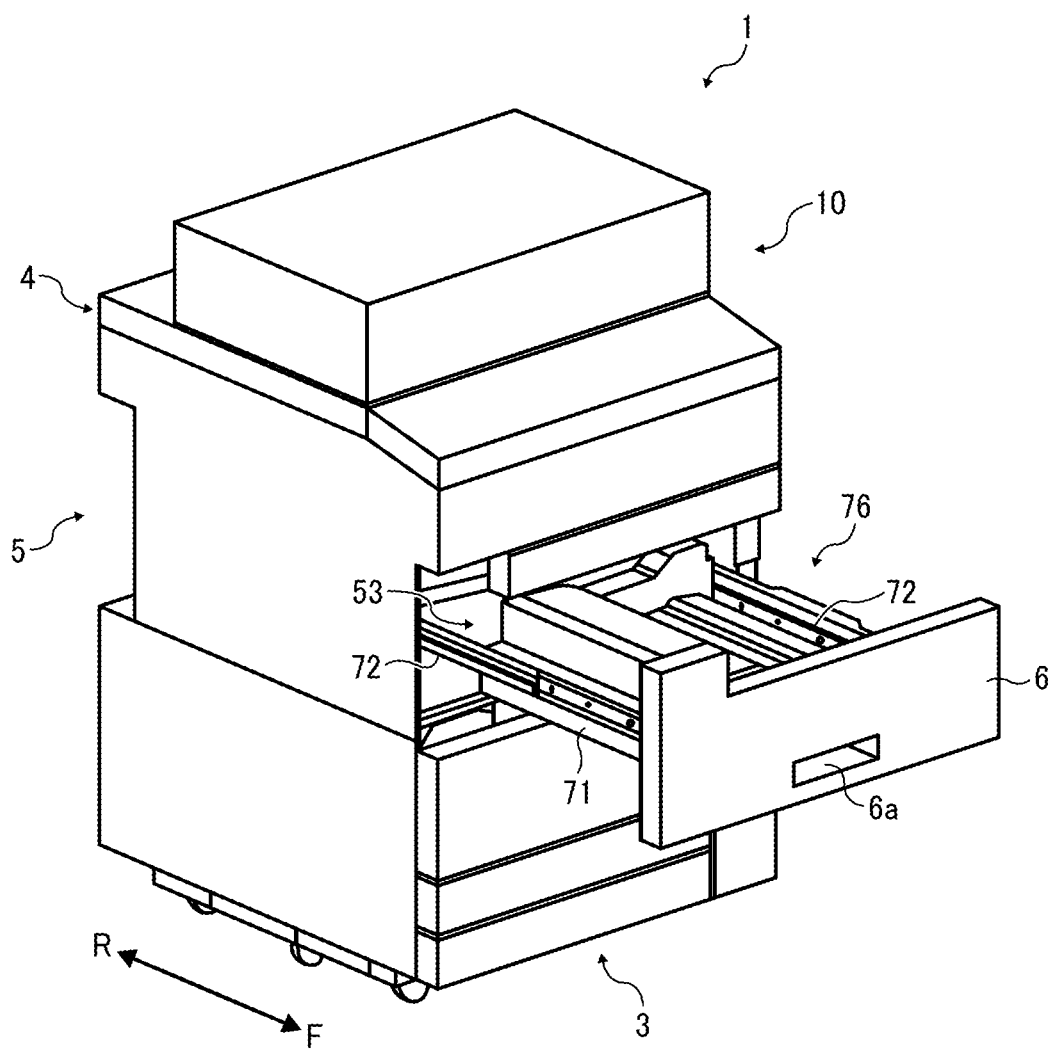
FIG. 2 is a perspective view of the image forming apparatus of FIG. 1.

FIG. 2 is a perspective view of the image forming apparatus 1. The image forming apparatus 1 according to the present embodiment includes a drawer unit 76 configured to be partially withdrawable from the image forming section 5, as shown in FIG. 2. The drawer unit 76 holds the secondary transfer device 52, the fuser unit 53, the main conveyance path 70, and the reverse conveyance path 73 as illustrated in FIG. 1.

Specifically, the drawer unit 76 includes a carrier 71 that holds the secondary transfer device 52, the fuser unit 53, the main conveyance path 70, and the reverse conveyance path 73. The carrier 71 is provided with a front cover 6. In addition, the carrier 71 is so supported as to move in the front-back direction (as indicated by double-headed arrow FR in FIG. 2) with respect to the image forming section 5 via rails 72 disposed inside the apparatus. When a user grabs a recessed handle 6a formed in the front cover 6 to move the front cover 6 in the proximal direction (see arrow FR in FIG. 2), the drawer unit 76 can be pulled out from the image forming section 5. More specifically, a front side F of the image forming apparatus 1 means a proximal side of the image forming apparatus 1, and a rear side R means a distal side of the image forming apparatus 1.

Figure 3:
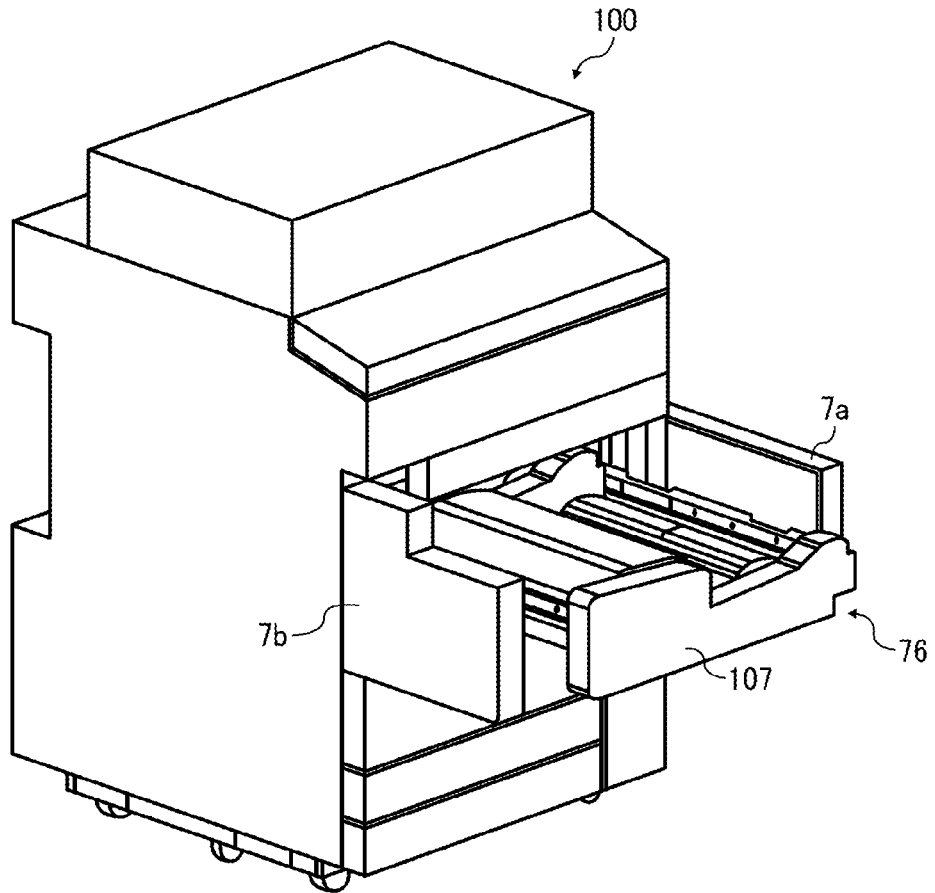
FIG. 3 is a perspective view of the image forming apparatus, with a front cover from a drawer unit.

As illustrated in FIG. 2, the front cover 6 is attached to the drawer unit 76. However, FIG. 3 illustrates another, alternative structure, in which front covers 7a, 7b are opened outward laterally to allow the drawer unit 76 to be moved.

As described above, in a state in which the secondary transfer device 52, the fuser unit 53, the main conveyance path 70, and the reverse conveyance path 73 are held by the carrier 71, the carrier 71 is movable in the front-back direction with respect to the image forming section 5. When the image forming apparatus 1 performs copying operation, the above parts and components carried by the carrier 71 is installed in the image forming section 5. The devices are pulled out in the frontal side F of the image forming section 5 for the replacement of the part or component and for the removal of the recording medium jammed and remained in the image forming section 5.

Figure 4:
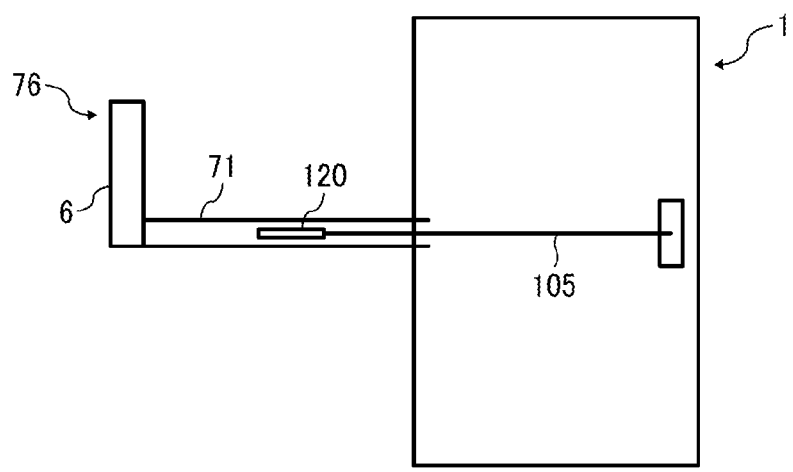
FIG. 4 is a schematic view of a state in which the drawer unit is pulled out.

FIG. 4 shows a schematic view of a state in which the drawer unit 76 is pulled out. In FIG. 4, for ease of description the secondary transfer device 52, the fuser unit 53, the main conveyance path 70, and the reverse conveyance path 73 which are held by the carrier 71 are omitted.

As illustrated in FIG. 4, the drawer unit 76 includes a printed circuit board 120 including control programs to cause the image forming apparatus 1 to perform various types of processing, such as: controls on the secondary transfer device 52, the fuser unit 53, the conveyance of the recording medium in the main conveyance path 70, the conveyance of the recording medium in the reverse conveyance path 73, and the jam detection.

In the present embodiment, as illustrated in FIG. 4, even when the drawer unit 76 is pulled out, electrical connection between the printed circuit board 120 and the image forming section is maintained by employing an electrical cable 105. Because the printed circuit board 120 is disposed in the drawer unit 76, the necessary connections between the printed circuit board 120 and the image forming section are implemented by the cable 105 alone, resulting in a streamlined configuration easily securing a path for the cable 105.

Figure 5:
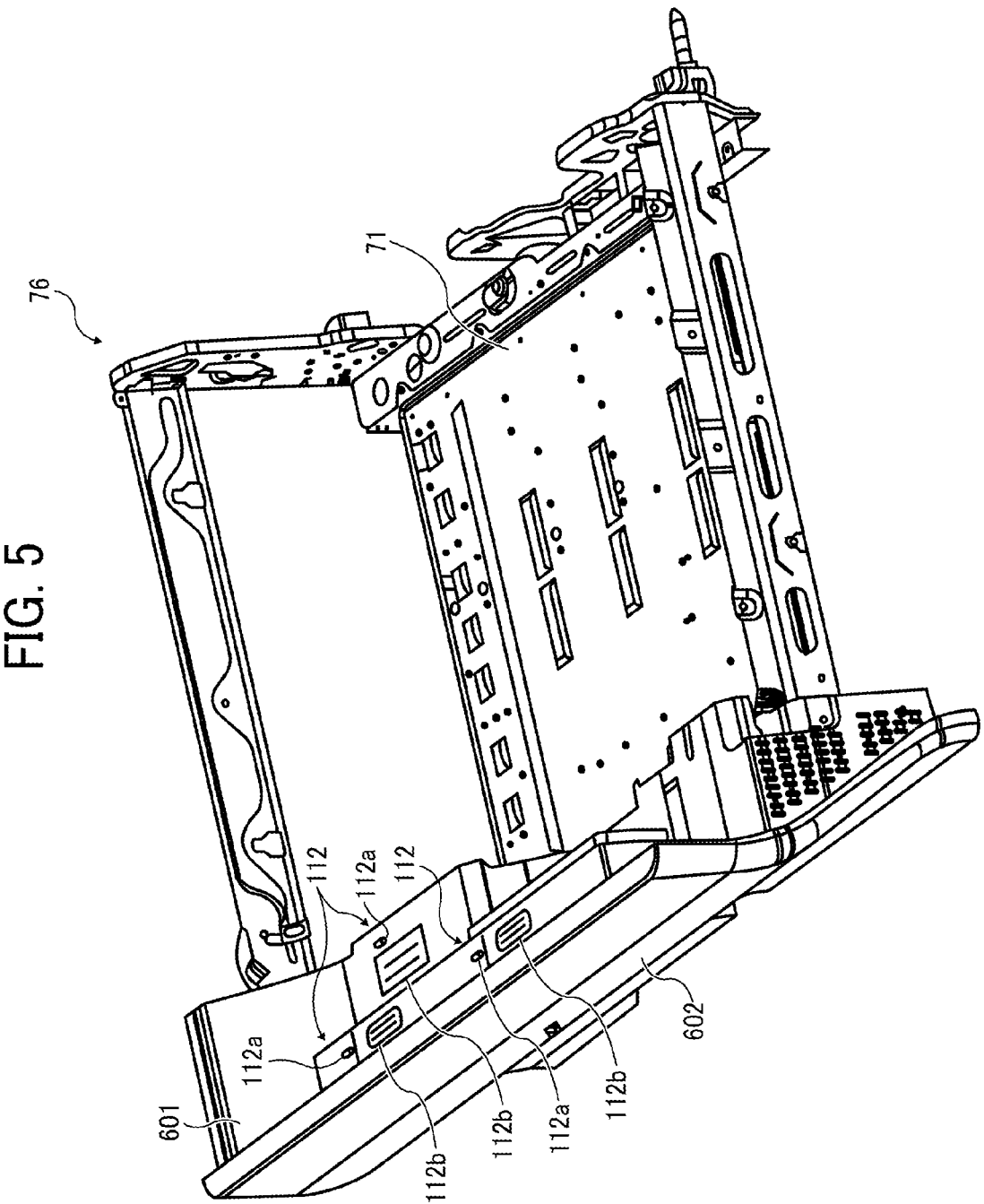
FIG. 5 shows a perspective view of the drawer unit.

FIG. 5 is a perspective view of the drawer unit 76. Similarly to FIG. 4, the secondary transfer device 52, the fuser unit 53, the main conveyance path 70, and the reverse conveyance path 73 which are held by the carrier 71 are omitted in FIG. 5 for simplification.

As illustrated in FIG. 5, the front cover 6 includes an outer cover 602 that remains exposed from the apparatus even when the drawer unit 76 is closed and installed in the image forming section, and an inner cover 601 that is only exposed when the drawer unit 76 is pulled out from the image forming section. A jam indicator 112 to report a location at which the paper jam occurs is disposed on an upper surface of the inner cover 601. The jam sensor indicator 112 includes, for example, an LED 112a and labels 112b to report a location at which the paper jam occurs.

Specifically, when a paper jam is detected at the secondary transfer device 52, the fuser unit 53, the main conveyance path 70, or the reverse conveyance path 73 held by the drawer unit 76, the LED 112a corresponding to the position at which the jam has occurred emits light. In the present embodiment, as illustrated in FIG. 4, even when the drawer unit 76 is pulled out, the image forming section and the drawer unit 76 are electrically connected via the cable 105. Accordingly, when the user pulls out the drawer unit 76 for handling the jammed paper, the LED 112a corresponding to the jam occurring position remains on. As a result, the user can visually confirm the labels 112b corresponding to the lit LED 112a, so that processing for the jam can be appropriately performed. In addition, after the jammed paper has been removed, if the sheet sensor does not detect the sheet anymore, the LED 112a is turned off. Then, once it is confirmed that all LEDs 112a are turned off, the drawer unit 76 is pushed into the image forming section and the jam removal terminates.

Preferably, the drawer unit 76 has a drawable length longer than the length of the drawer unit 76 in the pulling-out direction from the image forming section. In fact, because the drawer unit 76 can be pulled out by more than the length thereof, the secondary transfer device 52, the fuser unit 53, the main conveyance path 70, and the reverse conveyance path 73 held by the drawer unit 76 can be pulled out completely from the image forming section, therefore allowing the jam removal to be performed more effectively.

As to the disposition of the jam indicators 112, preferably the jam indicator 112 is disposed at a position easily visible from the front in a state in which the drawer unit 76 is opened. In the present embodiment, the jam indicator 112 are disposed on the upper surface of the inner cover 601 of the front cover 6 due to its greater visibility when the drawer unit 76 is pulled out from the image forming section. Alternatively, as illustrated in FIG. 3, when the drawer unit 76 does not include the front cover 6, the jam indicator 112 can be disposed on the part above the front plate 107 of the drawer unit because of its higher visibility.

As illustrated in FIG. 4, when the drawer unit 76 is pulled out from the image forming section, the cable 105 extends straight out in the pulling-out direction of the drawer unit 76. If the drawer unit 76 is moved rightward in FIG. 4 to restore the drawer unit 76 inside the image forming section, the cable 105 is folded. In particular, as in the present embodiment, because the drawer unit 76 is configured to be pulled out more than a length corresponding to the lateral length of the image forming apparatus, the moving amount of the drawer unit 76 is lengthened. As a result, the folding of the cable 105 also increases, and the cable 105 then sticks out from the drawer unit 76. If the cable 105 sticks out from the drawer unit 76, the cable 105 can get hung up on some part in the apparatus 1. If the drawer unit 76 is forcibly pushed back with the cable 105 hung up on a part in the image forming section, the cable 105 may be damaged or conductive wires exposed, or parts or components inside the apparatus may be damaged. It is possible that parts or components can be laid out in such as way as to avoid an area around the cable 105 so as not to cause the cable 105 to get caught on the parts inside the apparatus, but such a design usually increases the size of the image forming apparatus, which is undesirable.

Accordingly, in the present embodiment, the cable 105 is configured not to protrude from the drawer unit 76.

Figure 6:
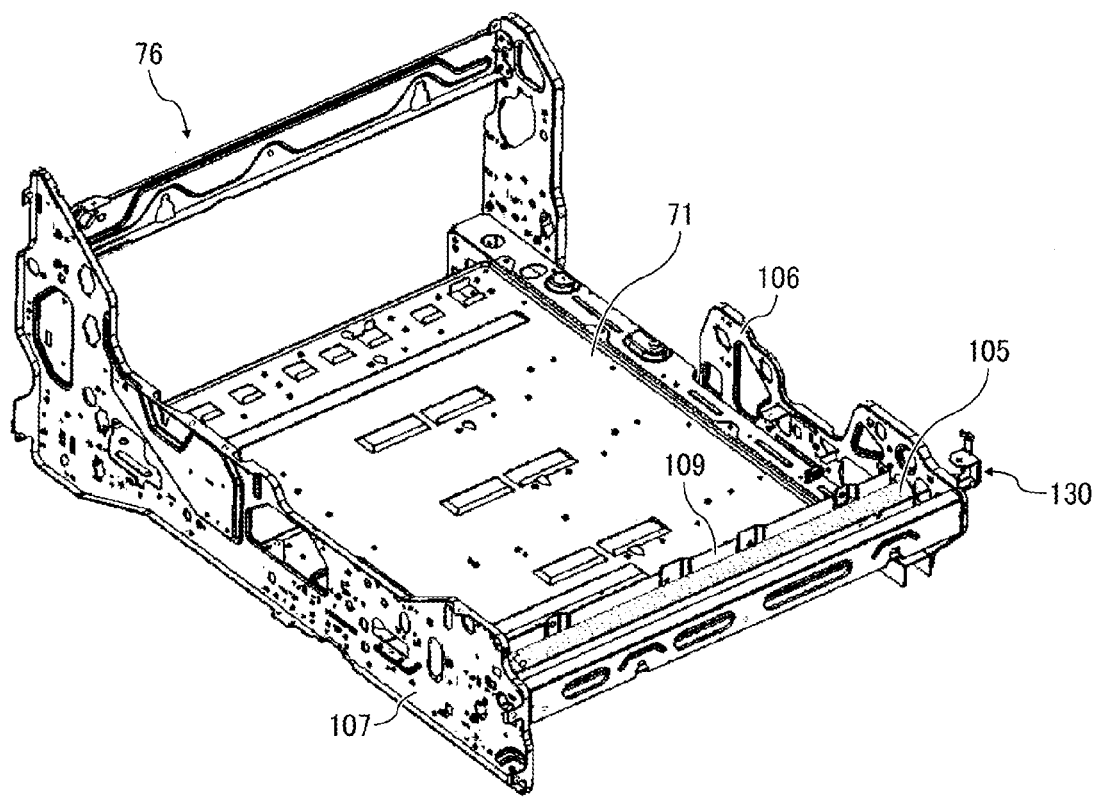
FIG. 6 shows a perspective view of the drawer unit installed in an image forming section of the image forming apparatus.
Figure 7:
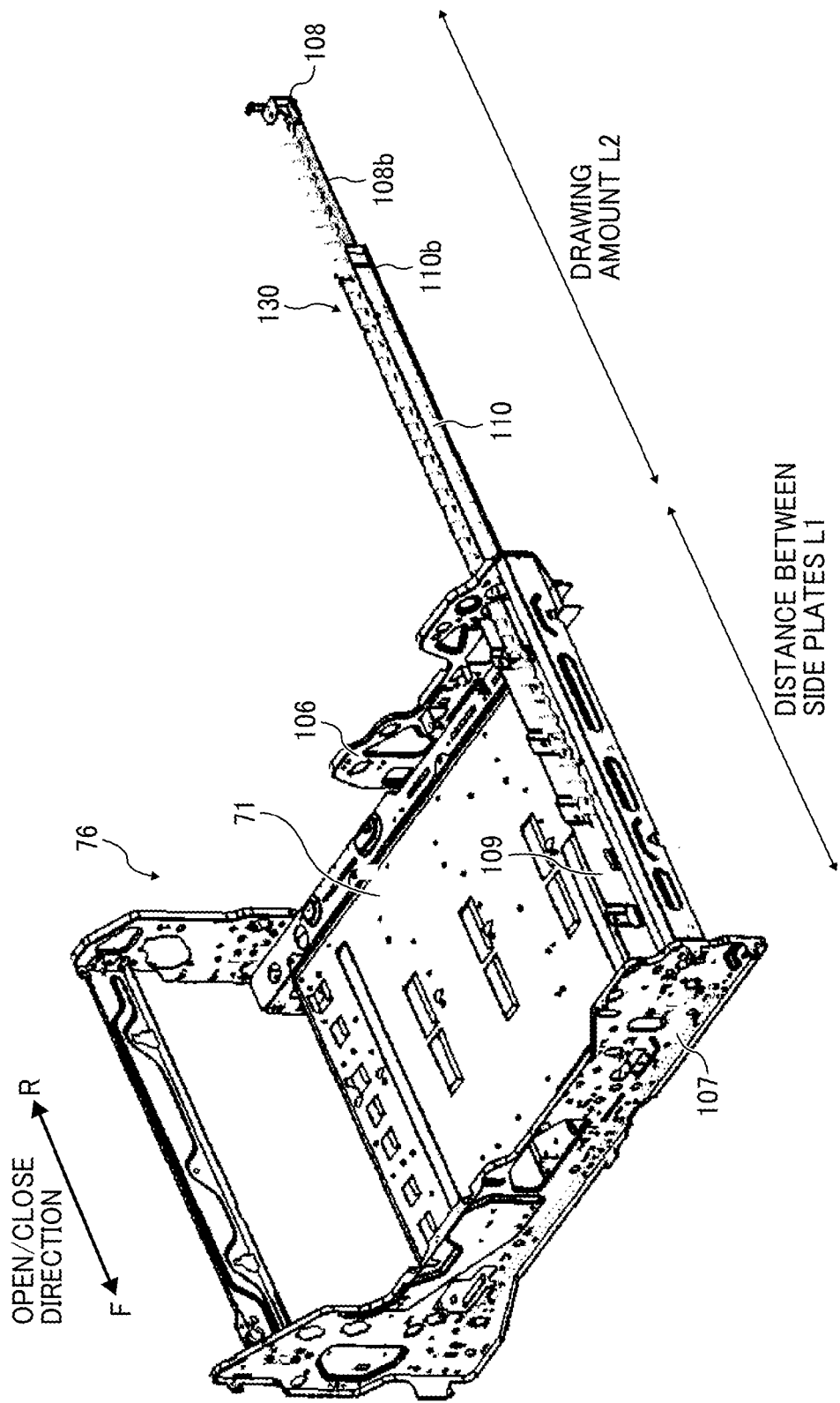
FIG. 7 shows a perspective view of the drawer unit pulled out from the image forming section.

FIG. 6 shows a perspective view of the drawer unit 76 stored in the image forming section. FIG. 7 shows a perspective view of the drawer unit 76 pulled out from the image forming section. In each of FIGS. 6 and 7, the secondary transfer device 52, the fuser unit 53, the main conveyance path 70, and the reverse conveyance path 73 held by the carrier 71 are omitted from the drawing for ease of description.

As illustrated in FIG. 6, the cable 105 according to the present embodiment is a spirally-wound curl cord and is held by a cable holder 130.

Figure 8:
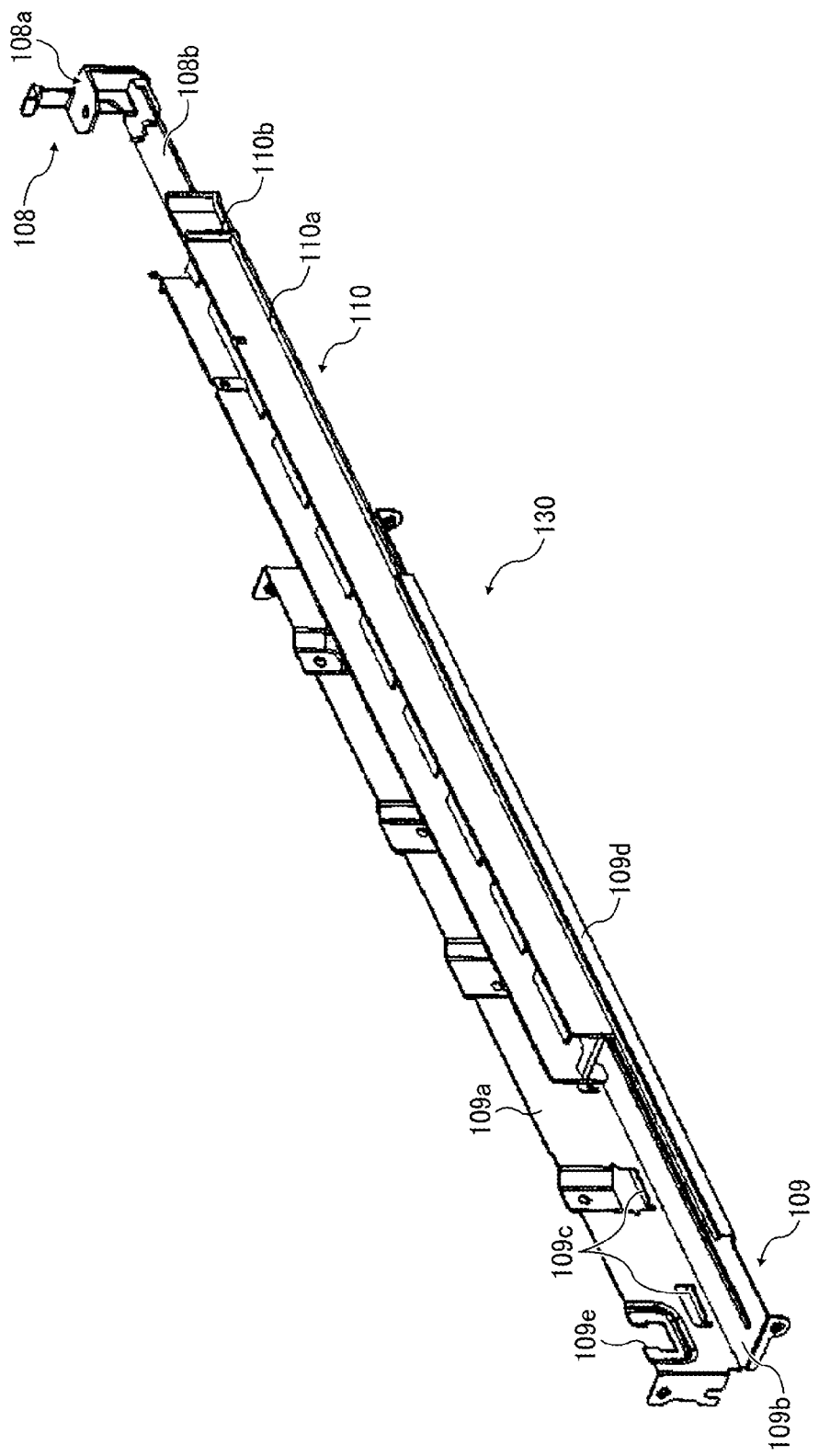
FIG. 8 is a perspective view of a cable holder.

FIG. 8 is a perspective view of the cable holder 130.

As illustrated in FIG. 8, the cable holder 130 includes a securing member 108 as a first member to be secured to the image forming section 5. In addition, the cable holder 130 further includes a drawer unit securing member 109, as a second member secured to the drawer unit 76. The cable holder 130 further includes a slidable member 110, which is a third member, movable relative to the securing member 108 and the drawer unit securing member 109. Each of the members 108, 109, and 110 is formed of sheet metal.

The drawer unit securing member 109 includes an L-shaped cross-section. One proximal edge thereof (the proximal side in FIG. 8) is fixed to a front plate 107 of the drawer unit 76 (see FIG. 6) with a screw and another distal edge thereof (the rear side in FIG. 8) is fixed to a rear plate 106 of the drawer unit 76 with a screw.

The drawer unit securing member 109 includes a side surface 109a. A plurality of left guide members 109c is disposed, opposite a bottom surface 109b, on the side surface 109a at a predetermined interval in the front-back direction of the apparatus. A right guide member 109d disposed on the right edge of the bottom surface 109b extends in the front-back direction of the apparatus. The right guide member 109d is bent to oppose the side surface 109a and its leading end is bent to oppose the bottom surface 109b. A cutout 109e is provided at a proximal side of the drawer unit securing member 109. The cable 105 held in the cable holder 130 is connected to a connector (not shown) disposed in the drawer unit 76 via the cutout 109e.

The slidable member 110 has a substantially H-shaped cross-section and includes flanged guided members 110a at both lateral ends. The slidable member 110 includes a contact member 110b to contact the rear plate 106 of the drawer unit 76.

The rear plate 106 of the drawer unit 76 includes an opening (not shown) through which the slidable member 110 and the securing member 108 are pulled out from the drawer unit 76. The slidable member 110 is pulled out from the not-shown opening of the rear plate 106 of the drawer unit and is inserted into the drawer unit securing member 109. Specifically, the left guided members 110a of the slidable member 110 are positioned between the bottom surface 109b of the drawer unit securing member 109 and the left guide member 109c. In addition, the right guided members 110a of the slidable member 110 are positioned between the bottom surface 109b of the drawer unit securing member 109 and the right guide member 109d. As a result, movement of the slidable member 110 in any direction other than the pulling-out direction is prohibited by the left guide members 109c and the right guide member 109d of the drawer unit securing member 109.

The securing member 108 includes a fixed part 108a to be fixed to the rear plate of the image forming section and a support part 108b extending in the front-back direction to support the cable 105. The support part 108b is placed on the slidable member 110.

Figure 13:
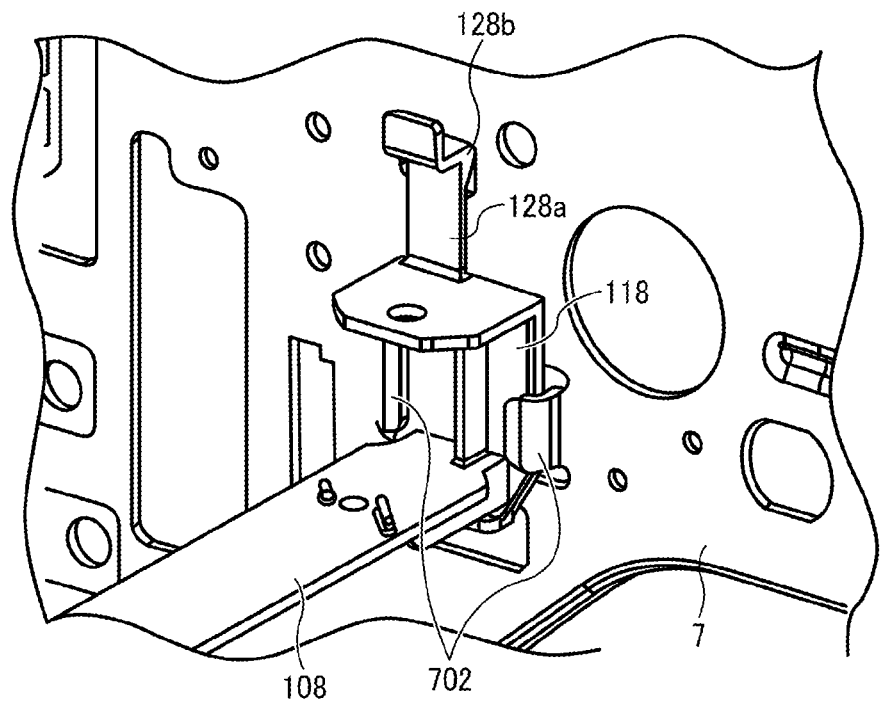
FIG. 13 is a perspective view illustrating a fixed part of a securing member and a rear plate of the image forming section.
Figure 14:
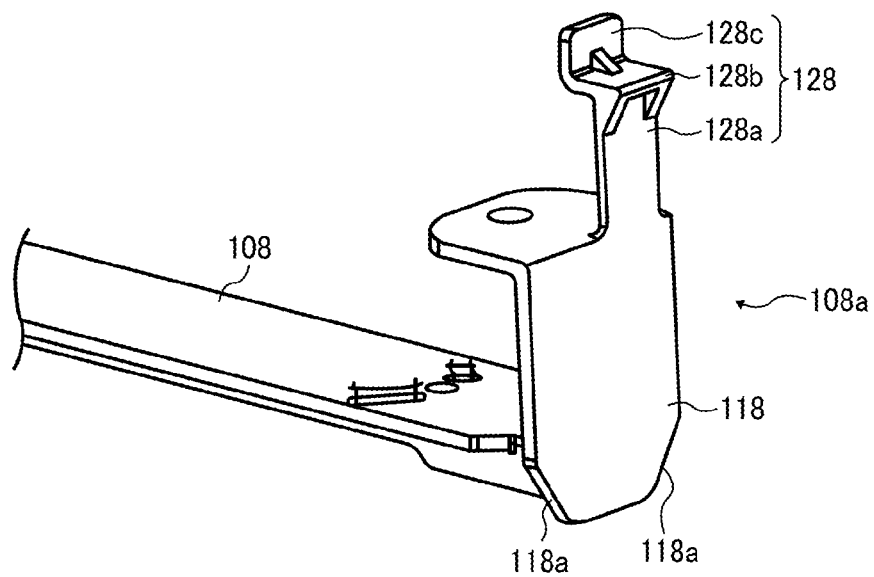
FIG. 14 is a perspective view illustrating the fixed part of the securing member.

Although not shown, the cable holder 130 further includes a disengagement prevention means to prevent the slidable member 110 from the drawer unit securing member 109 and the securing member 108 from the slidable member 110, respectively. FIG. 13 is a perspective view illustrating the fixed part 108a of the securing member 108 and a rear plate 7 of the body; FIG. 14 is a perspective view illustrating the fixed part 108a of the securing member 108; and FIG. 15 is a perspective view illustrating an area where the securing member 108 of the rear plate 7 of the body is fixed.

As illustrated in FIGS. 13 and 14, the fixed part 108a of the securing member 108 includes a mount part 118 parallel to the rear plate 7 and a retainer 128. The retainer 128 includes an elastic, deformable part 128a extending upward from the upper part of a mount part 118 and an engagement projection 128b disposed at an upper end of the elastic deformable part 128a. Further, the retainer 128 includes an operation part 128c for operation when the securing member 108 is removed from the rear plate 7. The bottom end of the engagement projection 128b has a slanted surface with a gradually increasing height upward from the elastic deformable part 128a.

The bottom end of the mount part 118 is provided with chamfered guide portions 118a.

Figure 15:
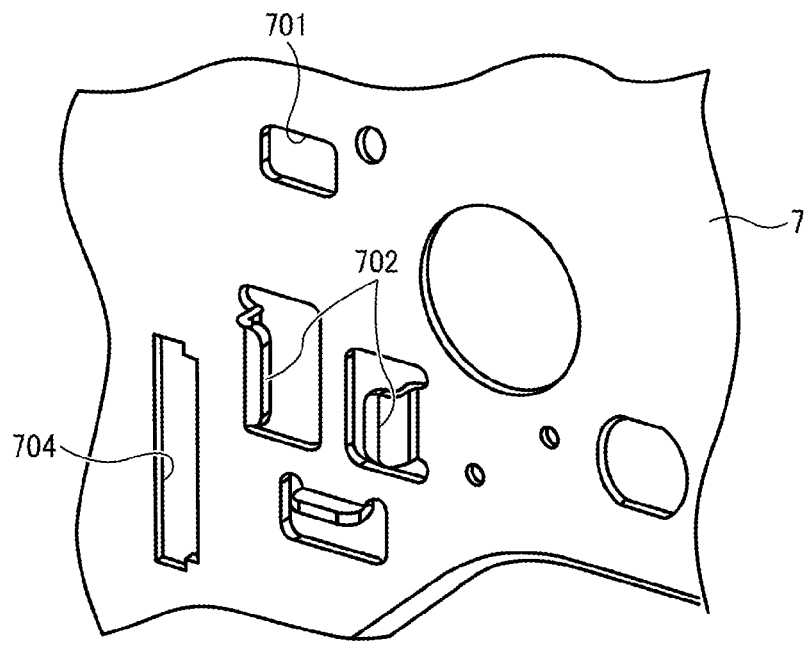
FIG. 15 is a perspective view illustrating an area where the securing member of the rear plate of the image forming section is fixed.

As illustrated in FIG. 15, the rear plate 7 includes a pair of plug-in tabs 702 into which the mount part 118 of the securing member 108 is inserted. In addition, an engagement hole 701 that the engagement projection engages is disposed above the plug-in tab 702. In addition, a connection slot 704 is disposed on the rear plate 7 near the plug-in tab 702. The cable 105 is connected to the body through the connection slot 704.

Figure 16:
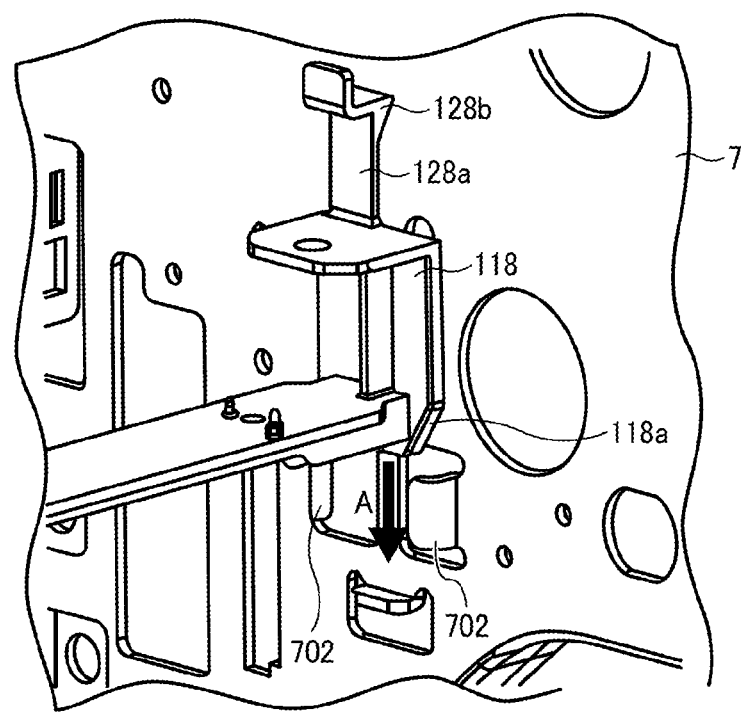
FIG. 16 is a view illustrating mounting the securing member to the rear plate of the apparatus.

FIG. 16 is a view illustrating mounting the securing member 108 to the rear plate 7 of the body.

Figure 17:
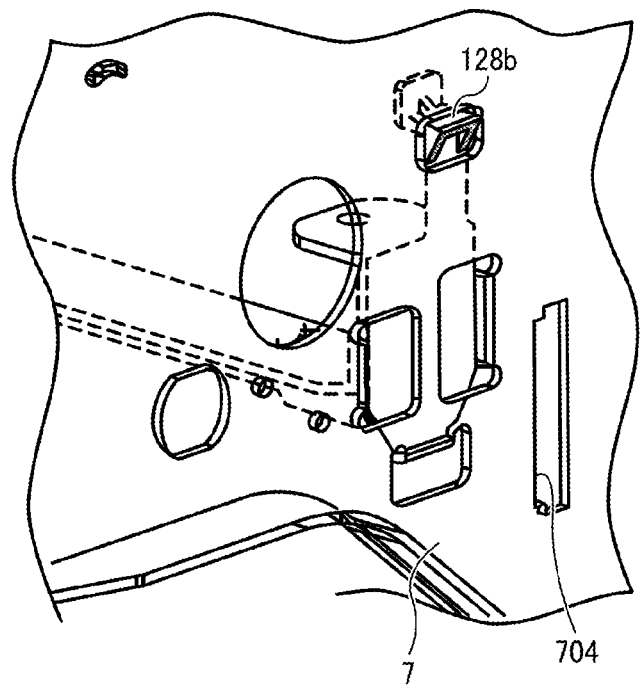
FIG. 17 is a rear view illustrating mounting the securing member to the rear plate of the apparatus.

When the securing member 108 is mounted to the rear plate 7, the securing member 108 is moved from above downward as indicated by arrow A in FIG. 16 and the mount part 118 is slidably moved along the rear plate 7. As a result, the mount part 118 is inserted into a portion between the plug-in tabs 702 and the rear plate 7. Further, the securing member 108 is fixed in the front-back direction (i.e., the pull-out direction of the drawer unit 76) and in the lateral direction. In addition, when the mount part 118 is inserted between the plug-in tabs 702 and the rear plate 7, at a certain point the engagement projection 128b of the retainer 128 engages the engagement hole 701 of the rear plate 7 as illustrated in FIG. 17. As a result, the securing member 108 is fixed vertically, so that the mount part 118 is prevented from disengaging from the portion between the plug-in tabs 702 and the rear plate 7.

According to the present embodiment, the securing member 108 can be mounted to the rear plate 7 simply by slidably moving the mount part 118 along the rear plate 7. As a result, compared to a case in which the securing member 108 is mounted to the rear plate 7 with screws, the mounting of the securing member 108 is easily performed. In addition, when mounting the securing member 108 with screws, equipment such as a screw driver is required; however, in the present embodiment, the securing member 108 can be attached to the rear plate 7 easily without using such equipment. In particular, trying to use a screw driver from the opening at a front side of the apparatus to the rear side of the apparatus is very difficult. In the present embodiment, because the securing member 108 can be mounted to the rear plate 7 simply by slidably moving the mount part 118 along the rear plate 7, the workability is improved in particular compared to the case of mounting using screws. Further, since no screws are used there are none to be lost inside the apparatus 1 that could damage internal parts.

The mount part 118 includes chamfered guide portions 118a with narrowing width downward, that is, downstream in the slidably moving direction. Accordingly, when the mount part 118 is inserted between the plug-in tab 702 and the rear plate 7 of the apparatus, even though the mount part 118 is shifted to the right or left, the guide portion 118a first contacts an upper part of the plug-in tab 702. Then, the slanted guide portion 118a allows the rear side of the securing member 108 to be guided to the right or left as necessary, so that the mount part 118 can be securely inserted into a portion between the plug-in tab 702 and the rear plate 7.

As described above, in the present embodiment, even though the mount part 118 is slightly shifted rightward or leftward, the guide portion 118a allows the securing member 108 to be securely mounted between the plug-in tab 702 and the rear plate 7. Thus, the mounting of the securing member 108 is performed easily.

In addition, when the mount part 118 is inserted between the plug-in tab 702 and the rear plate 7, the engagement projection 128b protruding toward the rear plate 7 beyond the mount part 118 strikes the rear plate 7. Because the elastic deformable part 128a deforms, the mount part 118 can slidably move along the rear plate 7. As a result, by slidably moving the mount part 118 along the rear plate 7, the mount part 118 can be inserted between the plug-in tab 702 and the rear plate 7.

Figure 18:
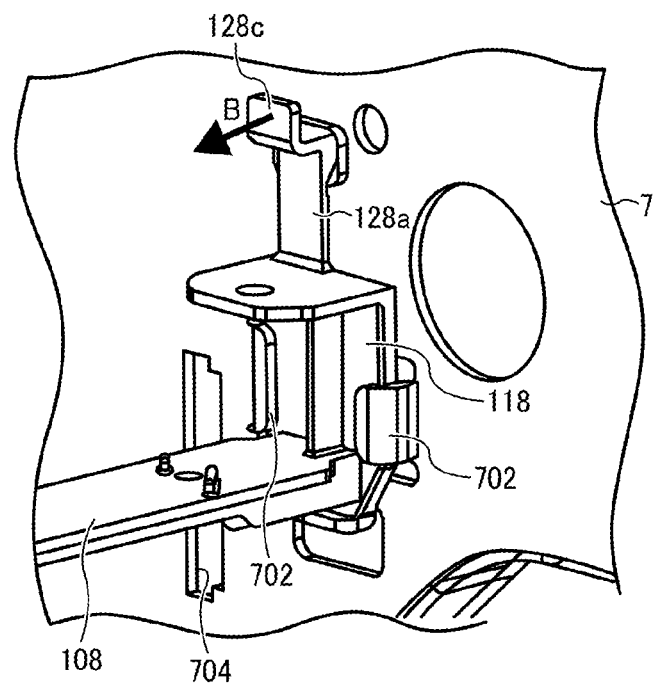
FIG. 18 is a view illustrating dismounting the securing member from the rear plate.

FIG. 18 is a view illustrating dismounting the securing member 108 from the rear plate 7.

When dismounting the securing member 108 from the rear plate 7, the user presses and bends the operation part 128c forward as shown by arrow B in the figure, so that the elastic deformable part 128a elastically deforms and disengages from the engagement hole 701. Then, the securing member 108 is slid upward and the mount part 118 is pulled out from the portion between the plug-in tab 702 and the side plate 7, so that the securing member 108 can be disengaged from the rear plate 7. As described above, in the present embodiment, the securing member 108 can be disengaged from the rear plate 7 easily without using any special equipment.

Figure 19:
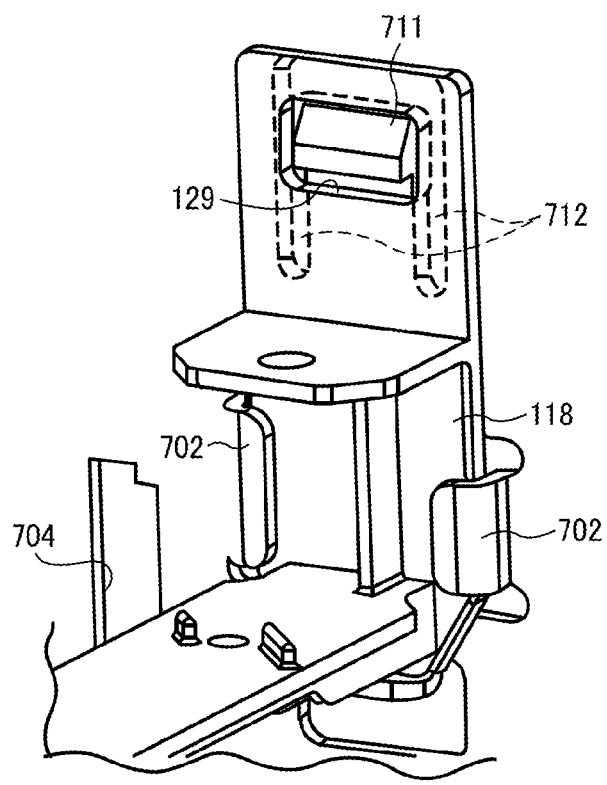
FIG. 19 is a view illustrating a structure in which the securing member includes an engagement slot, and the rear plate includes an elastically deformable member and an engagement projection.

In the above-described embodiment, the securing member 108 includes the engagement projection 128b and the elastic deformable part 128a, and the rear plate 7 of the apparatus includes the engagement hole 701. However, a structure as illustrated in FIG. 19 may also be used. Specifically, as illustrated in FIG. 19, the securing member 108 includes an engagement slot 129, and the rear plate 7 includes an elastically deformable member 712 and an engagement projection 711. In such a structure, the surrounding area of the engagement projection 711 of the rear plate 7 is cut out, so that the elastically deformable member 712 serves to displace the engagement projection 711 by its own elastic deformation. In the structure as illustrated in FIG. 19, when the mount part 118 is inserted between the plug-in tab 702 and the rear plate 7, the mount part 118 contacts the engagement projection 711 of the rear plate 7. Because the elastic deformable part 712 deforms elastically, the mount part 118 can slidably move along the rear plate 7. As a result, by slidably moving the mount part 118 along the rear plate 7, the mount part 118 can be inserted between the plug-in tab 702 and the rear plate 7.

Figure 20:
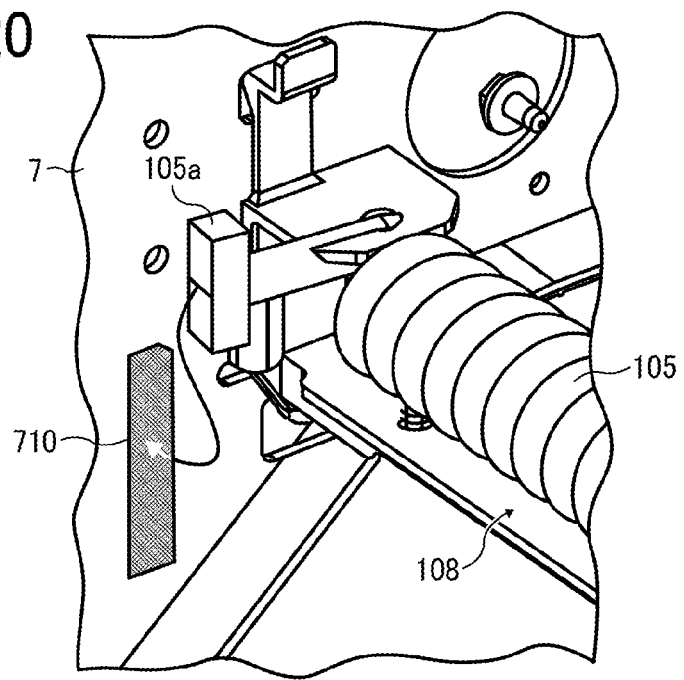
FIG. 20 is a view illustrating a state in which the cable held by the cable holder is connected to a connection port of the image forming section.

FIG. 20 is a view illustrating a state in which the cable 105 held by the cable holder 130 is connected to a connection port of the image forming section 5.

As illustrated in FIG. 20, a connector 710 for the image forming section 5 is fitted in the connection slot 704 of the rear plate 7. A cable connector 105a of the cable 105 is connected to the connector 710 for the image forming section embedded in the rear plate 7, so that a so-called panel mount structure is constructed. As a result, the cable 105 need not pass through the rear plate 7 and the cable 105 is easily connected to the image forming section.

Figure 9:
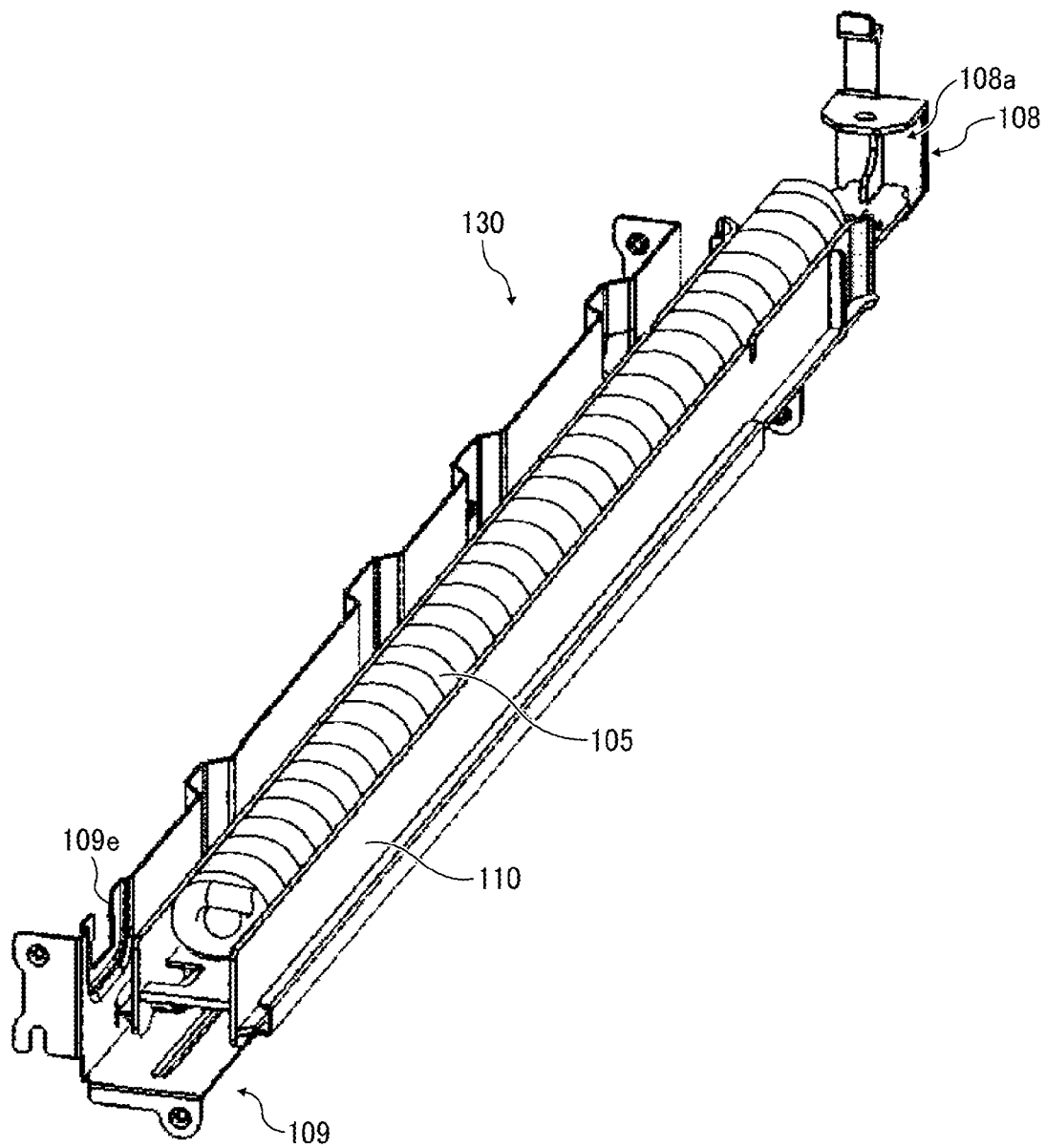
FIG. 9 is a perspective view of the cable holder holding the cable, illustrating a state in which the drawer unit is installed in the body.
Figure 10:
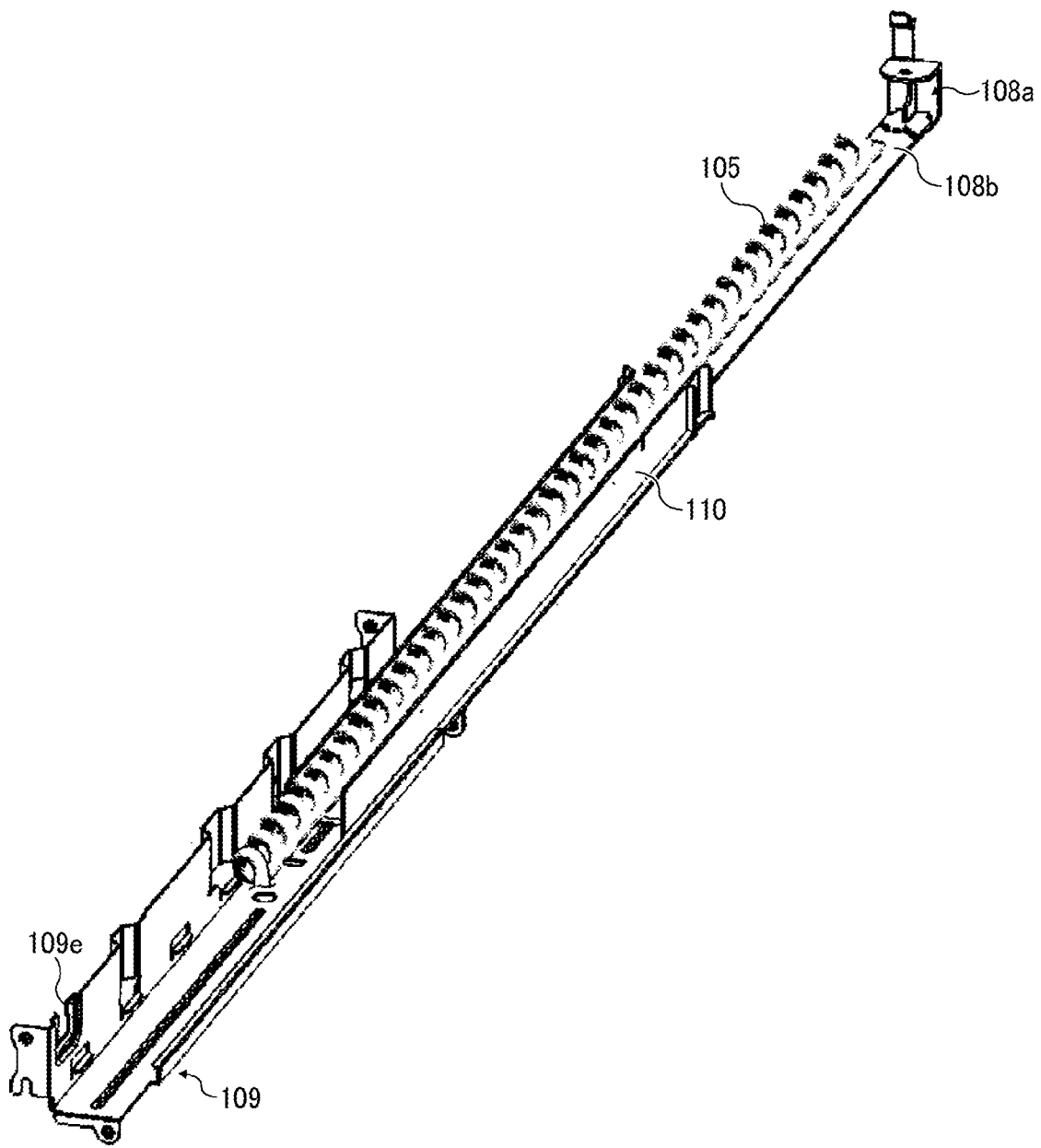
FIG. 10 is a perspective view of the cable holder, illustrating how to hold the cord when the drawer unit is pulled out from the image forming section.

FIG. 9 is a perspective view of the cable holder 130 holding the cable 105 illustrating a state in which the drawer unit 76 is installed in the image forming section of the body. FIG. 10 is a perspective view of a cable holder 130 holding the cable 105 illustrating a state in which the drawer unit 76 is pulled out from the image forming section. In FIGS. 9 and 10, illustration of the cable 105 is partly omitted. Specifically, the proximal side of the cable 105 extends to the cutout 109e and the distal side of the cable 105 extends up to the fixed part 108a of the securing member 108.

As illustrated in FIG. 6, when the drawer unit 76 is installed in the image forming section, the cable 105 and the cable holder 130 are installed in the drawer unit 76. As illustrated in FIG. 9, when the drawer unit 76 is installed in the image forming section, the slidable member 110 reaches the proximal side of the drawer unit securing member 109 and most of the slidable member 110 excluding a part in the distal side thereof is positioned on the drawer unit securing member 109. Similarly, most of the support part 108b of the securing member 108 excluding a part in the distal side is positioned on the slidable member 110.

As illustrated in FIG. 9, when the drawer unit 76 is installed in the image forming section, the cable 105 is held on the slidable member 110. At this time, the cable 105 is susceptible to folding; however, the cable 105 is substantially linearly held in the pull-out direction or the front-back direction by the slidable member 110.

As the drawer unit 76 is being pulled out, the securing member 108 moves relative to the slidable member 110 and is pulled out from the drawer unit 76, so that a length of the cable holder 130 in the pull-out direction (the front-back direction) is elongated. When the drawer unit 76 is pulled out to some extent, the disengagement prevention means of the securing member 108 contacts the slidable member 110. When the drawer unit 76 is further pulled out from this state, the slidable member 110 moves relative to the drawer unit securing member 109. Then, the slidable member 110 is pulled out from the drawer unit 76 and the length of the cable holder 130 in the pull-out direction (i.e., the front-back direction) further increases.

As illustrated in FIGS. 7 and 10, in the state in which the drawer unit 76 is pulled out from the image forming section, the proximal end of the cable 105 relatively pulled out from an interior of the drawer unit 76 is held by the slidable member 110. In addition, the proximal end of the cable 105 relatively pulled out from an interior of the drawer unit 76 is held by the support part 108b of the securing member 108. At this time, the cable 105 is fully extended and not folded.

In the present embodiment, two members including the slidable member 110 and the securing member 108 are relatively pulled out from the drawer unit 76. Accordingly, as illustrated in FIG. 7, even when a drawing amount L2 from the drawer unit 76 is longer than a distance L1 between the front plate 107 and the rear plate 106, the cable 105 can be held by the cable holder 130.

Next, when the drawer unit 76 is returned to the image forming section after the paper jam removal, the slidable member 110 is getting back to the drawer unit 76. At this time, the cable 105 once extended is loosened and becomes susceptible to folding. However, according to the present embodiment, the cable 105 is supported by the slidable member 110 and the support part 108b of the securing member 108, so that the folding of the cable 105 due to its own weight can be restricted. As a result, if seen from the pull-out direction (FR direction), the cable 105 does not protrude from the drawer unit 76 and is installed in the drawer unit 76 in a substantially straight state.

If the drawer unit 76 is returned to the image forming section, the contact member 110b of the slidable member 110 contacts the rear plate 106. If, from this state, the drawer unit 76 is further returned to the image forming section, the support part 108b of the securing member 108 is installed in the drawer unit 76 and finally returns to the state illustrated in FIGS. 6 and 9.

Thus, in the present embodiment, when the drawer unit 76 is returned to the image forming section, the cable 105 positioned at an outer side of the drawer unit 76 is supported by the slidable member 110 and the support part 108b of the securing member 108. Accordingly, the cable 105 is prevented from folding due to its own weight. As a result, if seen from the pull-out direction (FR direction), the cable 105 does not protrude from the drawer unit 76 and the drawer unit 76 can be returned to the image forming section. With this structure, when the drawer unit 76 is returned to the image forming section, the cable 105 is prevented from getting hung up on the part of the image forming section such as a gear, etc., thereby preventing damage to the parts inside the image forming section.

In addition, in the present embodiment, the cable 105 employs a curl cord extendible in the pull-out direction of the drawer unit 76. Because the cable 105 is extendible in the pull-out direction of the drawer unit 76, the cable 105 can be prevented from folding when the drawer unit 76 is returned to the image forming section, compared to a case using a non-extendable cable. As a result, if seen from the pull-out direction (FR direction), the cable 105 is securely prevented from protruding from the drawer unit 76.

In addition, in the present embodiment, when the drawer unit 76 is installed in the image forming section, the cable 105 and the cable holder 130 are installed in the drawer unit 76. As a result, there is no need to provide a storage space for the cable 105 and the cable holder 130 between the drawer unit 76 and the image forming section. Therefore, a compact and low-cost apparatus can be achieved.

When the drawer unit 76 is pulled out from the image forming section, the cable 105 inside the drawer unit 76 is placed on the drawer unit securing member 109. When the drawer unit 76 is returned to the image forming section, the cable 105 in the drawer unit 76 placed on the drawer unit securing member 109 runs on the slidable member 110. As illustrated in FIG. 9, the slidable member 110 has a substantially H-shaped cross-section, and there is a gap between the drawer unit securing member 109 and a surface of the slidable member 110 on which the cable 105 is placed. As a result, when the drawer unit 76 is returned to the image forming section, the cable 105 in the drawer unit 76 gets hung up on the proximal end of the slidable member 110. If the cable 105 gets hung up on the proximal end of the slidable member 110, the cable 105 may be buckled in the drawer unit 76. Moreover, if the drawer unit 76 is not set in the image forming section, the drawer unit 76 should be pulled out and reset.

Figure 21A:
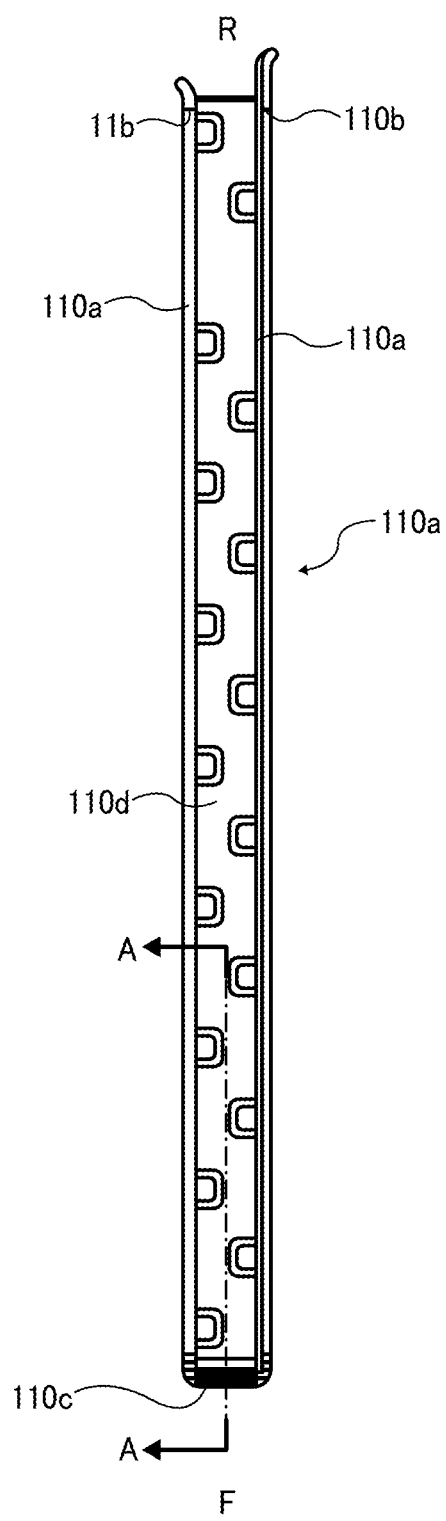
FIGS. 21A to 21B are schematic views illustrating a slidable member including a guide portion at a leading edge thereof.
Figure 21B:
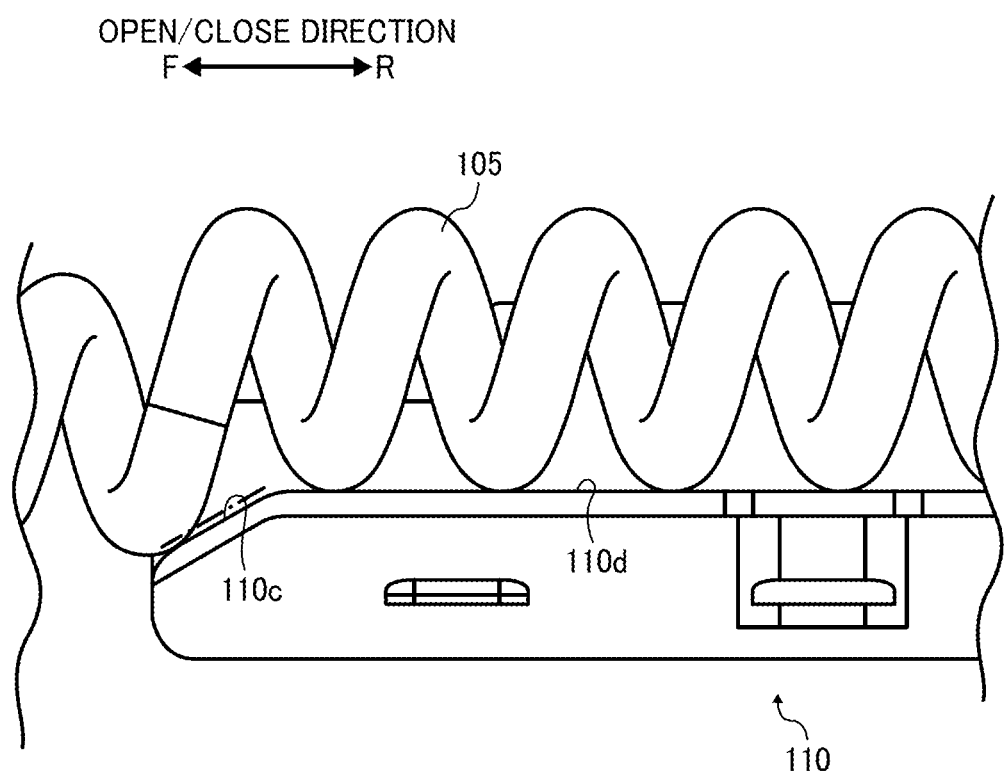

Accordingly, as illustrated in FIGS. 21A and 21B, a guide portion 110c to guide the cable 105 on the drawer unit securing member 109 to the proximal end of the slidable member 110 may be formed on a cable support surface 110d of the slidable member 110. The guide portion 110c is a chamfered surface sloping from the proximal end of the pull-out direction of the cable support surface 110d down to the drawer unit securing member 109.

By disposing a guide member on the slidable member 110, when the drawer unit 76 is returned to the image forming section, the cable 105 supported by the drawer unit securing member 109 can be guided to the cable support surface 110d of the slidable member 110 by the guide portion 110c. As a result, when the drawer unit 76 is returned to the image forming section, the cable 105 in the drawer unit 76 is prevented from getting hung up on the proximal end of the slidable member 110. As a result, the cable 105 may be prevented from being buckled in the drawer unit 76 and the need to reset the drawer unit 76 in the image forming section can be eliminated.

In the present embodiment, as described above, the cable 105 is prevented from moving toward the bottom side by the cable holder 130. In addition, the cable 105 is prevented from moving in the lateral direction by the slidable member 110 of the cable holder 130. However, the present cable holder 130 does not regulate upward movement of the cable 105, and therefore, the cable 105 may move upward in the following case. Specifically, when the drawer unit 76 is pulled out from the image forming section and is left as is for an extended period of time, the cable 105 will remain extended and deteriorate. If the drawer unit 76 is returned to be installed in the image forming section in a state in which the cable 105 is thus degraded, the cable 105 does not contract to the original shape and is buckled between the drawer unit 76 and the rear plate 7 of the apparatus. At this time, even though the cable 105 is prevented from moving in the lateral and upward direction by the slidable member 110 of the cable holder 130, there is no member to regulate upward movement of the cable holder 130. Accordingly, there is a concern that the cable 105 is buckled upward and the upwardly buckled part of the cable 105 gets hung up on the member disposed in the upper part of the cable holder 130. Moreover, if the drawer unit 76 cannot be set in the image forming section, the drawer unit 76 needs to be pulled out and reset.

Figure 22:
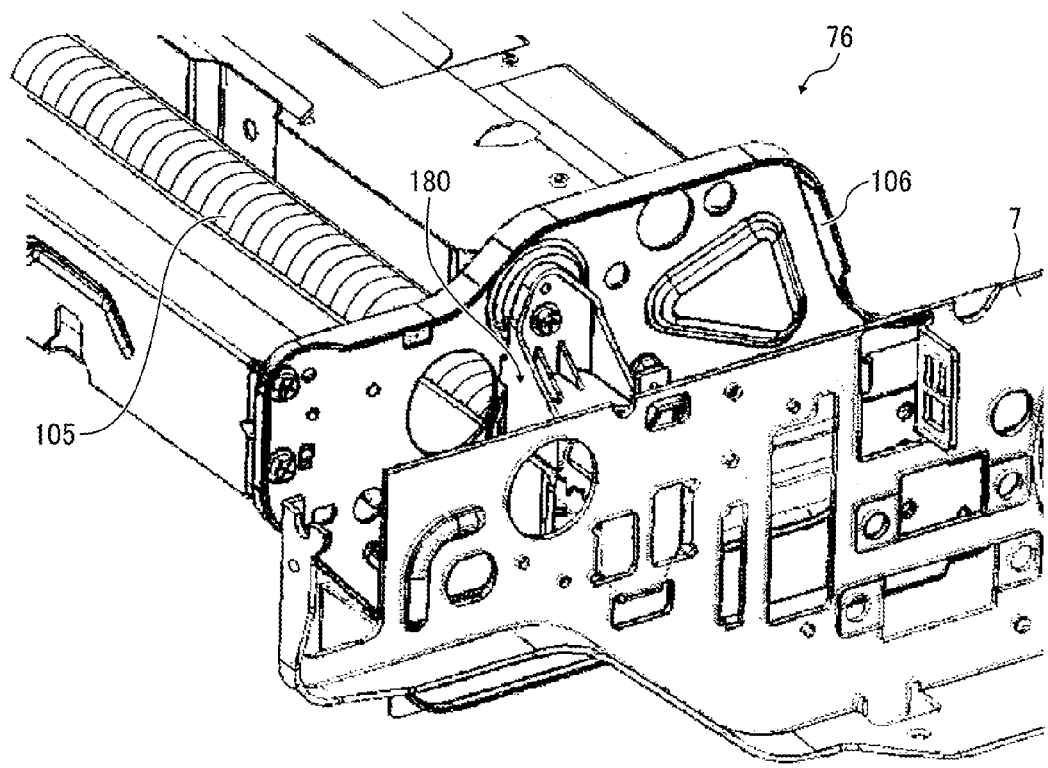
FIG. 22 is a perspective view of an exemplary drawer unit including a protective member disposed on the rear plate of the drawer unit.

Thus, as illustrated in FIG. 22, a protective member 180 may be disposed on the rear plate 106 of the drawer unit 76 so as to regulate upward movement of the cable 105.

Figure 23:
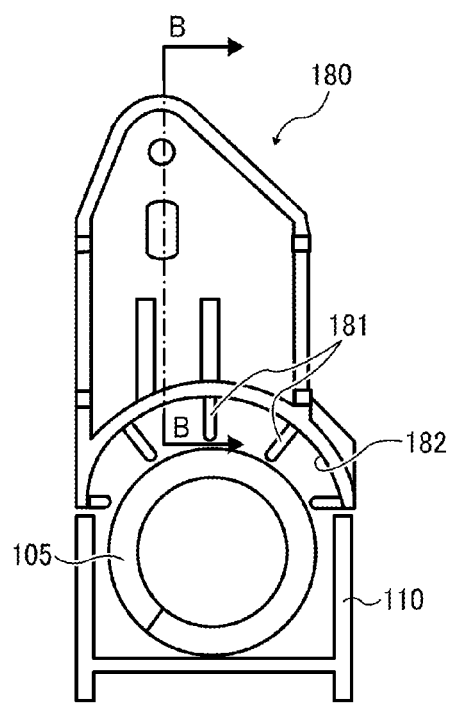
FIG. 23 shows a schematic configuration of the protective member, the slidable member, and the cable.

FIG. 23 shows a schematic configuration of the protective member 180, the slidable member 110, and the cable 105.

As illustrated in FIG. 23, the protective member 180 includes a semi-cylindrical cover 182. The cover 182 is so disposed as to cover an upper part of the cable 105 placed on the slidable member 110. A plurality of guide projections 181 extending from an interior wall of the cover 182 in a direction perpendicular to the interior wall of the cover 182 is disposed at constant intervals along the interior wall of the cover 182.

Figure 24:
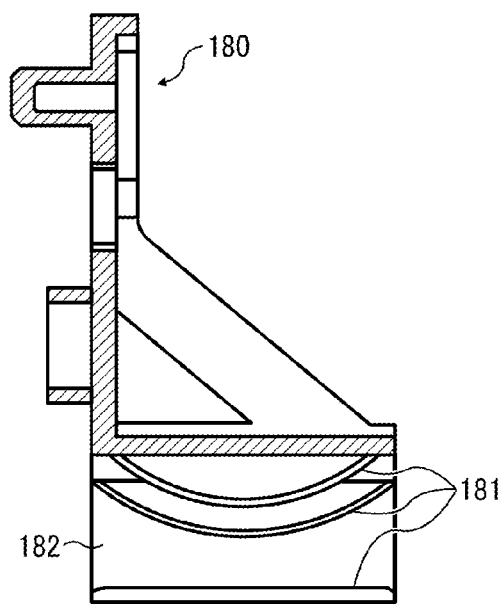
FIG. 24 is a cross-sectional view along Line A-A of FIG. 23.

FIG. 24 shows a cross-section taken along Line B-B of FIG. 23.

As illustrated in FIG. 24, each guide projection 181 is arc-shaped, with a height gradually increasing from the interior wall toward a center.

As illustrated in FIG. 23, the cover 182 of the protective member 180 and the slidable member 110 prevent the cable 105 from moving vertically and laterally other than in the front-back direction. In addition, as illustrated in FIG. 24, each of the guide projections 181 is arc-shaped. With this structure, the cable 105 moves to an area surrounded by the slidable member 110 and the cover 182 without getting hung up on the protective member 180, via the plurality of guide projections 181. As a result, the cable 105 is not buckled upward between the drawer unit 76 and the rear plate 7 and can be optimally installed in the drawer unit 76. Accordingly, the cable 105 is prevented from getting hung up on the parts disposed above the cable holder 130. Moreover, that the drawer unit 76 cannot be set in the image forming section and is pulled out and reset is prevented.

Figure 25:
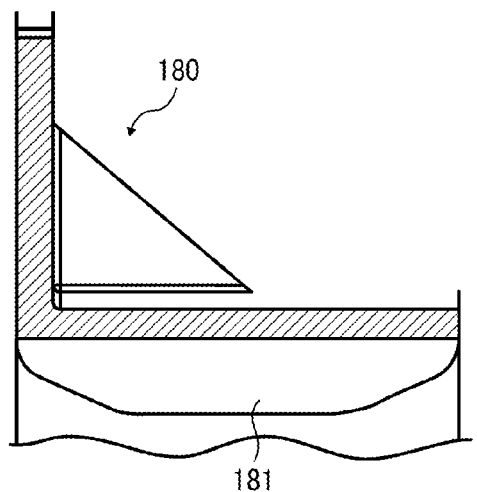
FIG. 25 is a modified example of the protective member including a modified guide projection.
Figure 26:
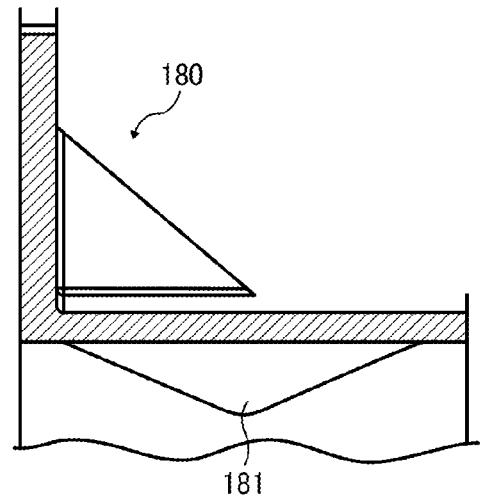
FIG. 26 is another modified example of the protective member including another modified guide projection.

In the above embodiment, the guide projections 181 are arc-shaped; however, as illustrated in FIG. 25, the guide projections 181 may be formed to include a linear central part with a same projection amount from the interior wall and slanted sections in which the projection amount from the interior wall becomes gradually reduced from its center to lateral ends. Alternatively, as illustrated in FIG. 26, each of the guide projections 181 may be formed in a downward mound-like shape. With the structures as illustrated in FIGS. 25 and 26, the cable 105 does not get caught on the protective member 180 and can move relative to the protective member 180 in the front-back direction.

Figure 27A:
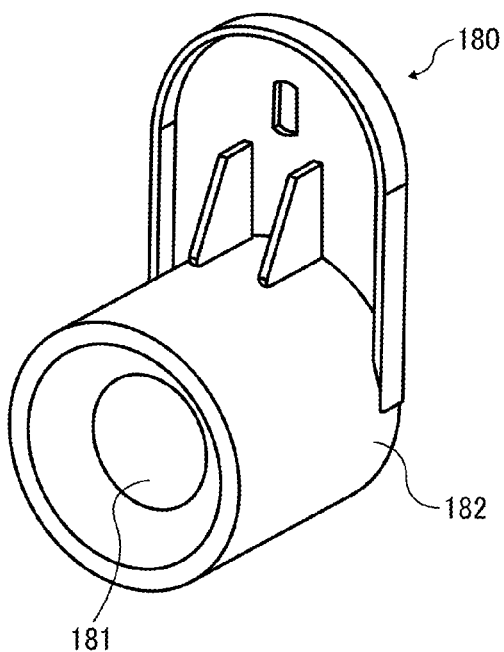
FIGS. 27A to 27C are views illustrating modified examples of the protective member.
Figure 27B:
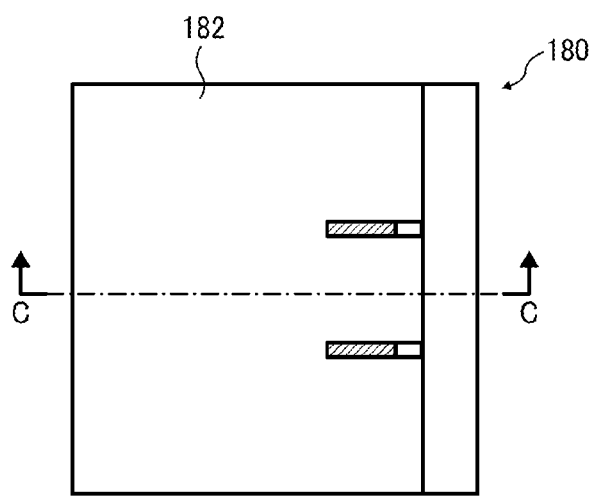
Figure 27C:
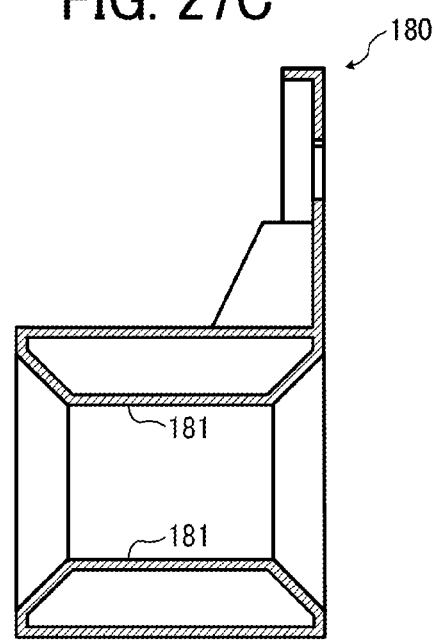

FIGS. 27A to 27C are views illustrating a modified example of the protective member 180. FIG. 27A is a perspective view of a modified example of the protective member 180; FIG. 27B is a plan view of the modified protective member 180; and FIG. 27C is a cross-sectional view taken along Line C-C in FIG. 27B.

The modified protective member 180 includes the cover 182 formed into a cylinder. The movement of the cable 105 in the vertical and lateral directions is regulated by the protective member 180 alone. In the structure as illustrated in FIGS. 27A to 27C, both lateral ends of the interior wall are formed into funeral form and the interior wall of the cover 182 serves as a guide projection 181. The modified protective member 180 can still reliably install the cable 105 in the drawer unit 76 even when the cable 105 is degraded to some extent.

Figure 11A:
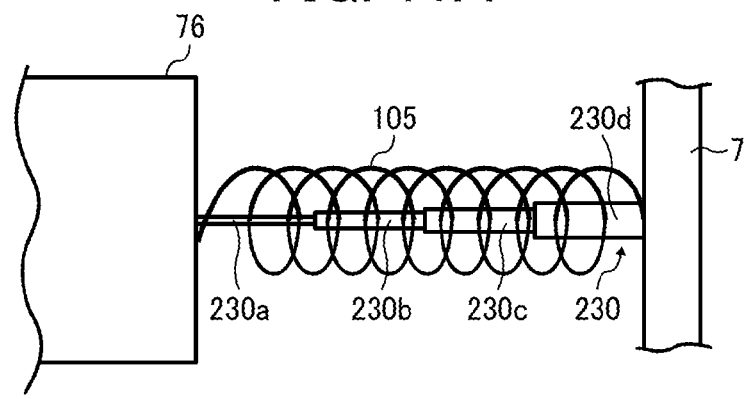
FIGS. 11A and 11B each show a general structure of a modified cable holder.
Figure 11B:
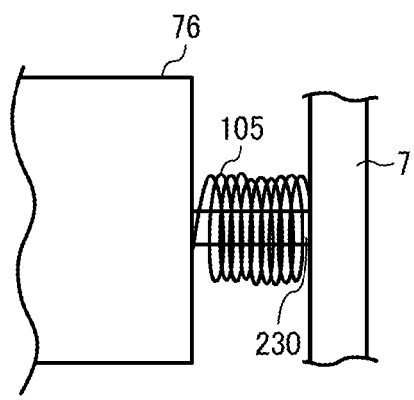

Next, a first modified example of the cable holder will be described. FIGS. 11A to 11B show schematic configurations of the modified example of a cable holder 230, of which FIG. 11A shows a state in which the drawer unit 76 is pulled out and FIG. 11B shows a state in which the drawer unit 76 is installed in the image forming section.

The modified cable holder 230 includes four telescoping cylindrical members 232a to 232d, each having a different diameter, so that the cable holder 230 passes through the curl cord-shaped cable 105, and one end thereof is fixed to the rear plate 7 and the other end is fixed to the drawer unit 76. As illustrated in FIG. 11A, the cylindrical member 232c1 having the largest diameter is fixed to the rear plate 7 in the image forming section. A cylindrical member 232c having the second largest diameter is slidably fitted in the largest cylindrical member 232d. A third-largest cylindrical member 232b is slidably fitted in the second-largest cylindrical member 232c. A cylindrical member 232a having the minimum diameter is slidably fitted in the third-largest cylindrical member 232b. A leading end of the cylindrical member 232a is fixed to the drawer unit 76.

When the drawer unit 76 pulled out from the image forming section as illustrated in FIG. 11A is returned to the original position, each of the cylindrical members 232a to 232c slidably moves to an inside of an adjacent cylinder, so that the front-to-back length (i.e., the lateral direction in the figure) shortens. When the cable 105 is released and winds due to its own weight, the cable 105 contacts the cable holder 230 and is prevented from folding. As a result, if seen from the pull-out direction (FR direction), the cable 105 does not protrude from the drawer unit 76 and the drawer unit 76 can be returned to the image forming section. In the first modified example 1, when the drawer unit 76 is returned to the image forming section, the cable 105 is prevented from getting hung up on the parts of the image forming section such as a gear, thereby preventing damage to the parts inside the image forming section.

Then, as illustrated in FIG. 11B, when the drawer unit 76 is installed in the image forming section, the cylindrical members 232a to 232c are installed in the cylindrical member 232d, so that the cable holder 230 does not interfere with the moving of the drawer unit 76.

In the present modified example as well, the cable holder 230 and the cable 105 can be configured to be installed in the drawer unit 76 when the drawer unit 76 is installed.

Figure 12:
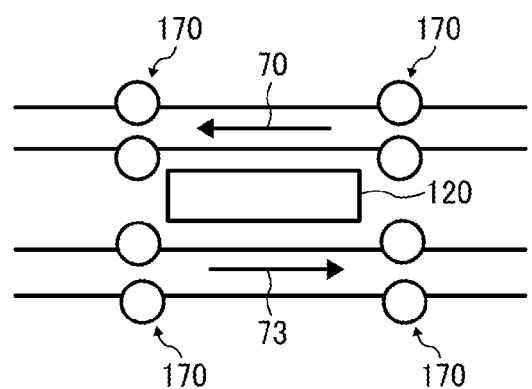
FIG. 12 is a perspective view illustrating an example in which a printed circuit board is disposed between a main conveyance path and a reverse conveyance path.

In addition, according to the above-described embodiment, the printed circuit board 120 is disposed at the carrier 71. Alternatively, however, the printed circuit board 120 can be disposed between the main conveyance path 70 and the reverse conveyance path 73. As illustrated in FIG. 1, the main conveyance path 70 and the reverse conveyance path 73 are disposed vertically side by side. Even though much effort has been made to shorten a distance between the main conveyance path 70 and the reverse conveyance path 73, because conveyance rollers 170 are disposed in the main conveyance path 70 and the reverse conveyance path 73, dead spaces are inevitably generated due to the diameter of the conveyance roller. As illustrated in FIG. 12, by disposing the printed circuit board 120 in the dead space, the space in the image forming section may effectively be used. In addition, by disposing the printed circuit board 120 between the main conveyance path 70 and the reverse conveyance path 73, the printed circuit board 120 with a size corresponding to the maximum width of the conveyed sheet can be disposed, thereby improving the feasibility of the printed circuit board 120.

In addition, as described above, due to the use of the extendable member such as a curl cord for the cable 105, the folding of the cable 105 can be reduced compared to a case in which non-extendable member is used for the cable 105. As a result, if seen from the pull-out direction, the cable 105 is securely prevented from protruding from the drawer unit with use of the extendable member such as a curl cord, without changing the cable holder depending on the configuration of the image forming apparatus. Specifically, even though the highly rigid cable 105 is used or that the drawer unit is installed in the image forming section, if the cable 105 is allowed to be in the extended state, folding of the cable 105 itself can be restricted to a certain degree. As a result, the cable 105 is securely prevented from protruding from the drawer unit 76. If the apparatus to which the cable 105 of the present embodiment is applied is relatively small and the pulling-out length is short, use of the extendable curl cord as the cable 105 may prevent the cable 105 from protruding from the drawer unit 76.

Additional modifications and variations of the present invention are possible in light of the above teachings. It is therefore to be understood that, within the scope of the appended claims, the invention may be practiced other than as specifically described herein.

What is claimed is:
1. An image forming apparatus comprising:
an image forming section;
a conveyance path to convey a recording medium to the image forming section;
a drawer unit including the conveyance path and configured to be pulled out relative to the apparatus;
an electrical cable to electrically connect the drawer unit and an interior of the apparatus even when the drawer unit is pulled out from the apparatus; and
a cable holder to ensure that the cable is securely prevented from protruding from the drawer unit wherein, in a state in which the drawer unit is installed in the image forming section of the apparatus, the cable and the cable holder are installed in the drawer unit,
wherein the cable is a spirally curled cable, the cable holder is defined by a plurality of cylindrical members each having a different diameter, each of which is slidably fitted into the next to form an extendable cable holder, and wherein the curled cord is wrapped around the cable holder.

2. The image forming apparatus as claimed in claim 1, wherein the cable holder comprises:
a first member fixed to the apparatus;
a second member fixed to the drawer unit; and
a third member movable relative to the first and second members.

3. The image forming apparatus as claimed in claim 2, further comprising:
a guide portion formed on a cable support surface of the third member to guide the cable on the second member to a proximal end of the third member,
wherein the guide portion is a chamfered surface sloping from the proximal end of the third member down to the support surface to support the cable on the second member.

4. The image forming apparatus as claimed in claim 1, further comprising:
a first regulating member as the cable holder;
a second regulating member to regulate movement of the cable in a direction other than a pull-out direction of the drawer unit and other than a direction regulated by the first regulating member,
wherein the second regulating member is disposed at a rear plate of the drawer unit and regulates movement of the cable between the drawer unit and the apparatus.

5. The image forming apparatus as claimed in claim 4, wherein the second regulating member includes a plurality of guide projections extending in a direction perpendicular to an interior wall of the second regulating member.

6. The image forming apparatus as claimed in claim 5, wherein the plurality of guide projections to guide the cable includes slanted lateral ends.

7. The image forming apparatus as claimed in claim 1, further comprising a connector for the apparatus to which the cable is connected,
wherein the connector is disposed on a rear plate of the apparatus.

8. The image forming apparatus as claimed in claim 1, wherein a length of the drawer unit is greater than a depth of the apparatus.

9. The image forming apparatus as claimed in claim 1, further comprising a printed circuit board disposed in the drawer unit parallel to the conveyance path.

10. The image forming apparatus as claimed in claim 9, wherein:
the drawer unit includes a second, reverse conveyance path disposed opposite the conveyance path to convey the recording medium to the image forming section; and
the printed circuit board is disposed between the main conveyance path and the reverse conveyance path.

11. The image forming apparatus as claimed in claim 10, wherein the cable electrically connects the printed circuit board and the apparatus.

12. An image forming apparatus comprising:
an image forming section;
a conveyance path to convey a recording medium to the image forming section;
a drawer unit including the conveyance path and configured to be pulled out relative to the apparatus;
an electrical cable to electrically connect the drawer unit and an interior of the apparatus even when the drawer unit is pulled out from the apparatus; and
a cable holder to ensure that that the cable is securely prevented from protruding from the drawer unit, wherein the cable holder comprises:
a first member fixed to the apparatus;
a second member fixed to the drawer unit; and
a third member movable relative to the first and second members, wherein the first member is a securing member,
the securing member including:
a mount part to slidably move parallel to a rear plate of the apparatus to be mounted to plug-in tabs; and
a retainer to prevent the mount part from removing from the plug-in tabs by fitting in an engagement hole in the rear plate.

13. The image forming apparatus as claimed in claim 12, further comprising:
a guide portion, disposed downstream in the slidable movement of the mount part, to guide the mount part to be inserted into the pair of plug-in tabs.

14. The image forming apparatus as claimed in claim 12, wherein the retainer includes an elastically deformable member that deforms to displace the engagement projection.

15. An image forming apparatus comprising:
an image forming section;
a conveyance path to convey a recording medium to the image forming section;
a drawer unit including the conveyance path and configured to be pulled out relative to the apparatus;
an electrical cable to electrically connect the drawer unit and an interior of the apparatus even when the drawer unit is pulled out from the apparatus;
a cable holder to ensure that the cable is securely prevented from protruding from the drawer unit wherein, in a state in which the drawer unit is installed in the image forming section of the apparatus, the cable and the cable holder are installed in the drawer unit; and
at least one jam indicator, disposed at the drawer unit, to indicate a location of a paper jam in the conveyance path,
wherein the at least one jam indicator is disposed at a position easily visible from the front when the drawer unit is pulled out from the apparatus and exposed.

* * * * *